United States Patent
Tsai et al.

(10) Patent No.: US 11,450,742 B2
(45) Date of Patent: Sep. 20, 2022

(54) FINFET STRUCTURE AND METHOD FOR MANUFACTURING THEREOF

(71) Applicant: TAIWAN SEMICONDUCTOR MANUFACTURING COMPANY LTD., Hsinchu (TW)

(72) Inventors: Chun Hsiung Tsai, Hsinchu County (TW); Lai-Wan Chong, Kaohsiung (TW); Chien-Wei Lee, Kaohsiung (TW); Kei-Wei Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/796,060

(22) Filed: Oct. 27, 2017

(65) Prior Publication Data
US 2018/0053825 A1    Feb. 22, 2018

Related U.S. Application Data

(62) Division of application No. 14/600,781, filed on Jan. 20, 2015, now Pat. No. 9,806,154.

(51) Int. Cl.
*H01L 29/10* (2006.01)
*H01L 29/66* (2006.01)
(Continued)

(52) U.S. Cl.
CPC .... *H01L 29/1037* (2013.01); *H01L 21/26586* (2013.01); *H01L 29/0649* (2013.01);
(Continued)

(58) Field of Classification Search
None
See application file for complete search history.

(56) References Cited

U.S. PATENT DOCUMENTS

| 5,844,278 A | 12/1998 | Mizuno et al. |
| 2004/0256683 A1* | 12/2004 | Lee .............. H01L 21/823412 |
| | | 257/412 |

(Continued)

FOREIGN PATENT DOCUMENTS

CN    103855015 A    6/2014

OTHER PUBLICATIONS

Office Action and Search Report dated Sep. 18, 2018 issued by the China National Intellectual Property Administration (CNIPA) for counterpart application No. 201510216725.9.

(Continued)

*Primary Examiner* — Abul Kalam
(74) *Attorney, Agent, or Firm* — WPAT, P.C., Intellectual Property Attorneys; Anthony King

(57) ABSTRACT

Present disclosure provides a FinFET structure, including a fin and a gate surrounding a first portion of the fin. A dopant concentration in the first portion of the fin is lower than about $1E17/cm^3$. The FinFET structure further includes an insulating layer surrounding a second portion of the fin. The dopant concentration of the second portion of the fin is greater than about $8E15/cm^3$. The insulating layer includes a lower layer and an upper layer, and the lower layer is disposed over a substrate connecting to the fin and has a dopant concentration greater than about $1E19/cm^3$.

20 Claims, 22 Drawing Sheets

(51) Int. Cl.
*H01L 29/78* (2006.01)
*H01L 29/06* (2006.01)
*H01L 21/265* (2006.01)

(52) U.S. Cl.
CPC .... *H01L 29/1083* (2013.01); *H01L 29/66795* (2013.01); *H01L 29/66803* (2013.01); *H01L 29/7851* (2013.01)

(56) References Cited

U.S. PATENT DOCUMENTS

| | | | |
|---|---|---|---|
| 2010/0055886 A1* | 3/2010 | Izumida | H01L 29/66818 438/514 |
| 2011/0207309 A1 | 8/2011 | Izumida et al. | |
| 2012/0086053 A1* | 4/2012 | Tseng | H01L 29/66795 257/288 |
| 2013/0280883 A1* | 10/2013 | Faul | H01L 21/2255 438/434 |
| 2014/0054679 A1* | 2/2014 | Tang | H01L 21/26586 257/329 |
| 2015/0044829 A1* | 2/2015 | Kim | H01L 21/823807 438/199 |

OTHER PUBLICATIONS

English abstact translation of CN 103855015 A.

\* cited by examiner

FINFET STRUCTURE AND METHOD FOR MANUFACTURING THEREOF

CROSS-REFERENCE TO RELATED APPLICATION

This application is a divisional of U.S. application Ser. No. 14/600,781, filed Jan. 20, 2015.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalk. Although existing FinFET devices and methods of fabricating FinFET devices have been generally adequate for their intended purposes, they have not been entirely satisfactory in all respects. For example, a variation of fin width and profile, especially at an end of the fin, raises challenges in a FinFET process development. It is desired to have improvements in this area.

BRIEF DESCRIPTION OF THE DRAWINGS

Aspects of the present disclosure are best understood from the following detailed description when react with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
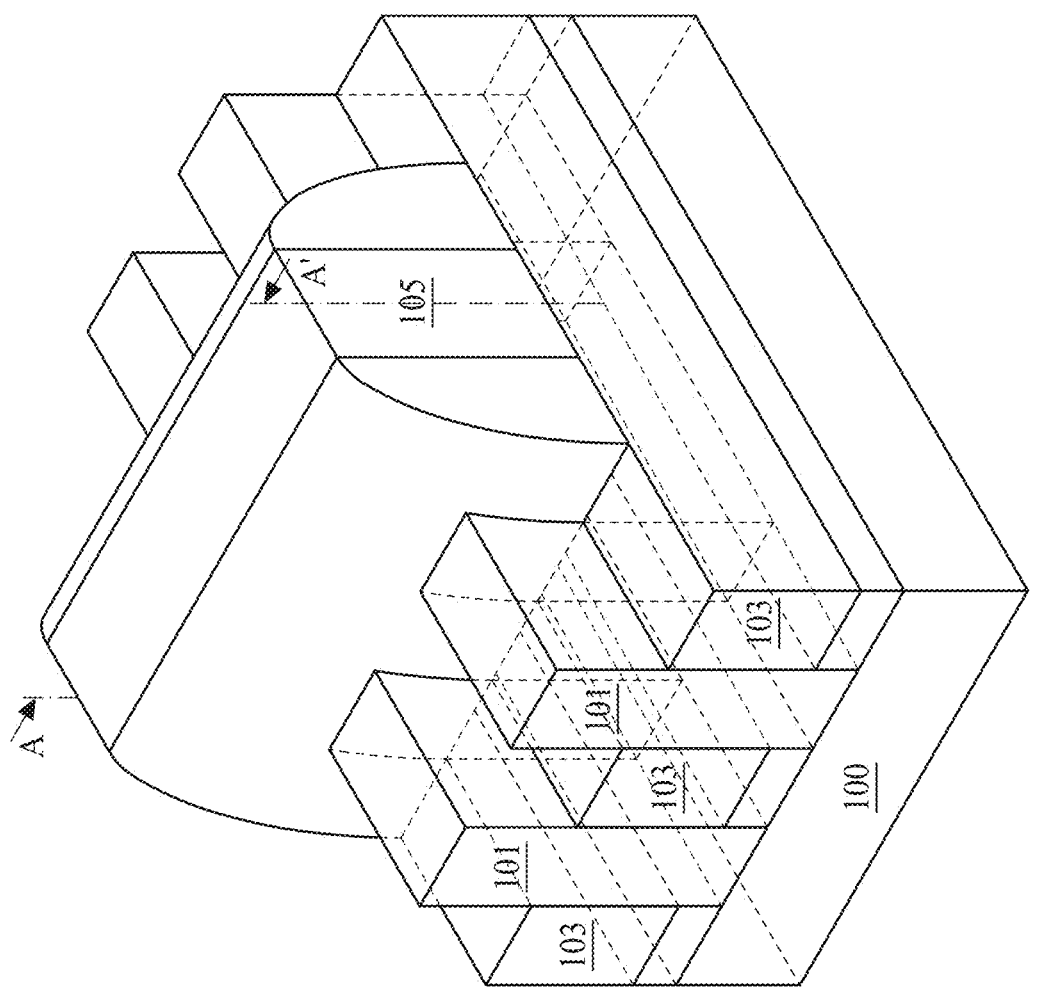
FIG. 1 shows a perspective view of a FinFET structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Forming a semiconductor well of a specific conductive type in a bulk silicon (Si) fin by ion implantation can be performed after the fin has been formed. Ions are implanted, for example, in a normal incidence, into a predetermined depth of the fin through a protective layer disposed on a top surface of the fin. That is, the ion beam is perpendicular to the wafer surface, travelling through the protective layer, and arrived at the predetermined depth of the fin. The dopant level or concentration may be controlled by the energy applied to the ions. However, implantation through the top surface of the fin (hereinafter "fin top implantation") inevitably introduces high levels of crystal lattice defects, which causes carrier mobility degradation in the fin.

After the fin top implantation, undesired background doping concentration greater than about $1E17/cm^3$ is introduced into the fin, including the channel region positioning in proximity to the top surface and the sidewalls of the fin. Due to the ionized impurity scattering effect, not only the carrier mobility in the channel region is significant degraded but also the device performance is greatly impacted. Furthermore, the lattice defects created by the travel of high energy dopants and the surface roughness between the interface of the fin and gate oxides as a result of the fin top implantation contribute to more carrier scattering.

Forming an anti-punch through region in the fin at a depth shallower than that of the semiconductor well region can be carried out by a perpendicular fin top implantation or by a tilted fin top implantation. Both measures lead to undesired background doping concentration greater than $1E17/cm^3$ at the channel region of the fin.

Since the dopant concentration shows Gaussian distribution with respect to different levels of depth in the target to be implanted, the longer path the ionized dopants have to travel in the target, the more evident the Gaussian distribution can be observed. The aforesaid dopant concentration distribution undermines the uniformity of the dopant concentration at predetermined regions such as well or anti-punch through in a fin structure. For example, a uniform dopant concentration at the anti-punch through region can gain a better short-channel control in a FinFET structure.

Given the above discussion, a FinFET structure with a substantially dopant-free channel region and uniformly doped region such as well and anti-punch through is desired in achieving greater carrier mobility, better device performance, and suppressing short-channel effect in an ever-shrinking FinFET structure. In some embodiments of the present disclosure, a FinFET structure includes a fin and a gate surrounding a channel portion of the fin is provided. A dopant concentration in the channel portion of the fin is lower than about $1E17/cm^3$. In some embodiments of the present disclosure, a method for manufacturing the FinFET structure described herein is provided. The dopant concentration at particular portions or regions of a semiconductor fin described herein can be measured by secondary ion mass spectrometry (SIMS).

Referring to FIG. 1 of the present disclosure. FIG. 1 is a perspective view of a FinFET structure 10 according to some embodiments of the present disclosure. Two fins 101 are protruding from a semiconductor substrate 100 and are surrounded by an insulating layer 103 such as shallow trench isolation (STI). A gate 105 is positioned over the fins 101 and the insulating layer 103, surrounding a first portion of the fins 101. In some embodiments, the gate 105 is a metal gate with multiple conformal metal layers. In some embodiments, the FinFET structure 10 in FIG. 1 can have raised source and drain (not shown) partially below a top surface of the fins 101. The first portion refers to the portion of the fin 101 higher than the adjacent insulating region 103 and being surrounded by the gate 105. For example, a cross section dissecting along line AA in FIG. 1 may show a rectangular first portion surrounded by the gate 105. In some embodiments, a dopant concentration of the first portion is lower than a predetermined value such that people having ordinary skill in the art may not considered as an intended doped region, for example, lower than about $1E17/cm^3$. In some embodiments, the dopant concentration of the first portion is contributed by dopants diffused from an anti-punch-through region under the first portion of the fin.

Figure 2:
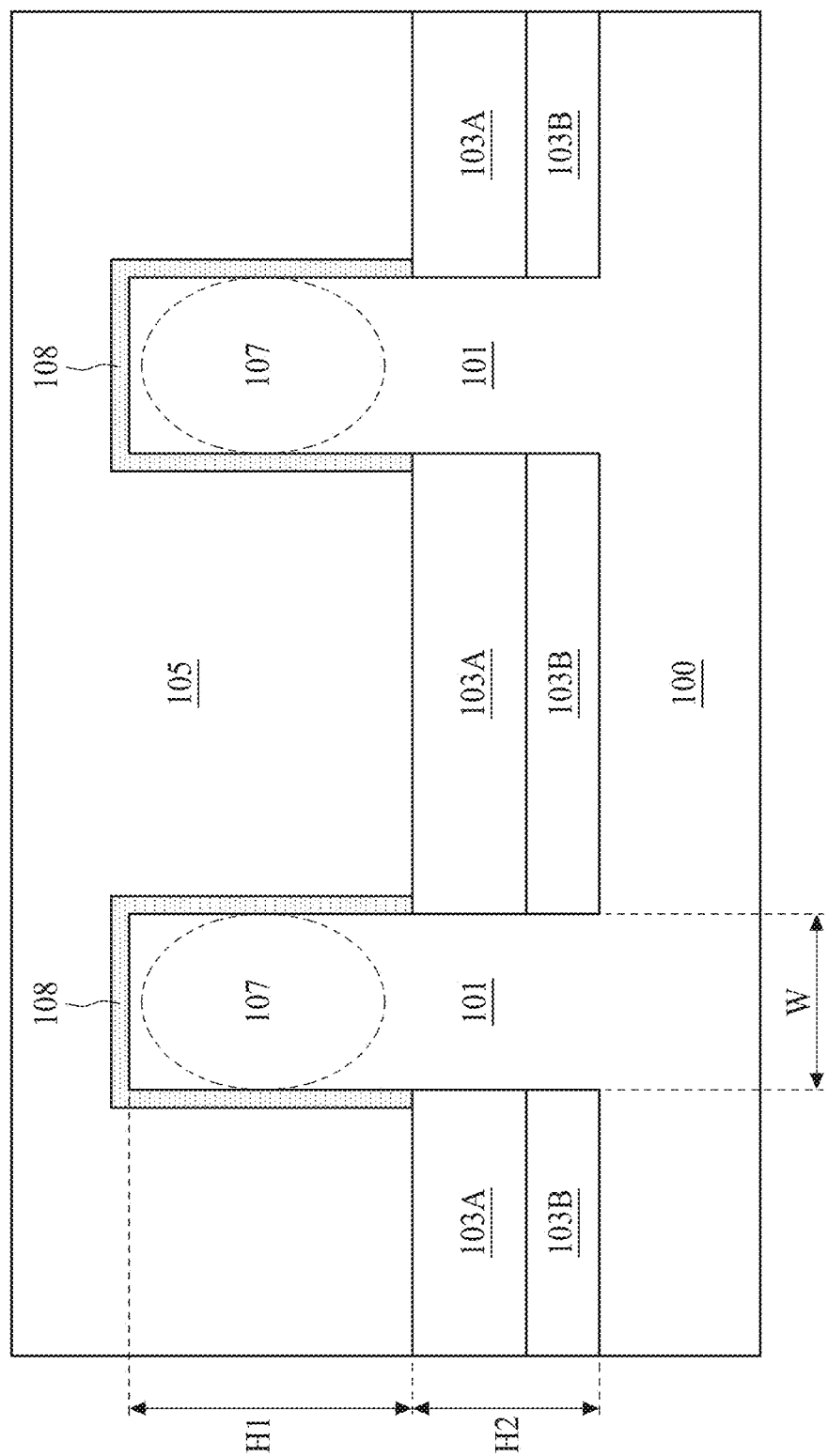
FIG. 2 shows a cross sectional view of a FinFET structure, in accordance with some embodiments of the present disclosure.

FIG. 2 shows a cross sectional view of a FinFET structure according to some embodiments of the present disclosure. The cross sectional view in FIG. 2 can be dissected along line AA of FIG. 1 in some FinFET structures of the present disclosure. The first portion 107 of the fin 101 is enclosed in the dotted oval. A gate dielectric layer 108 is positioned between the first portion 107 and the gate 105. Alternatively stated, the first portion 107 of the fin 101 is protruding from the insulating layers 103A, 103B and having a height H1 in a range of from 30 nm to about 50 nm. The portion of the fin surrounded by the insulating layers 103A, 103B can possess a height H2 greater or smaller than the height H1. In some embodiment, the height H2 is in a range of from about 60 nm to about 100 nm. A width W of the fin 101 can be in a range of from about 5 nm to about 15 nm. The insulating layer 103A, 103B includes a lower layer 103B positioned over the substrate 100 and an upper layer 103A positioned over the lower layer 103B. In some embodiments, the lower layer 103B and the upper layer 103A are formed in different manufacturing operations and an interface can be observed therebetween due to a formation interruption.

In some embodiments, the lower layer 103B has a greater dopant concentration than the upper layer 103A. For example, the lower layer 103B can have a dopant concentration greater than about $1E19/cm^3$, at least two orders of magnitude greater than the dopant concentration in the first layer 103A. For another example, For example, the upper layer 103A can have a dopant concentration lower than about $1E17/cm^3$, at least two orders of magnitude lower than the dopant concentration in the second layer 103B. In some embodiments, except for some unintended dopants in the upper layer 103A as a result of dopant diffusion in later annealing operations, the upper layer 103A is essentially dopant-free.

Figure 3:
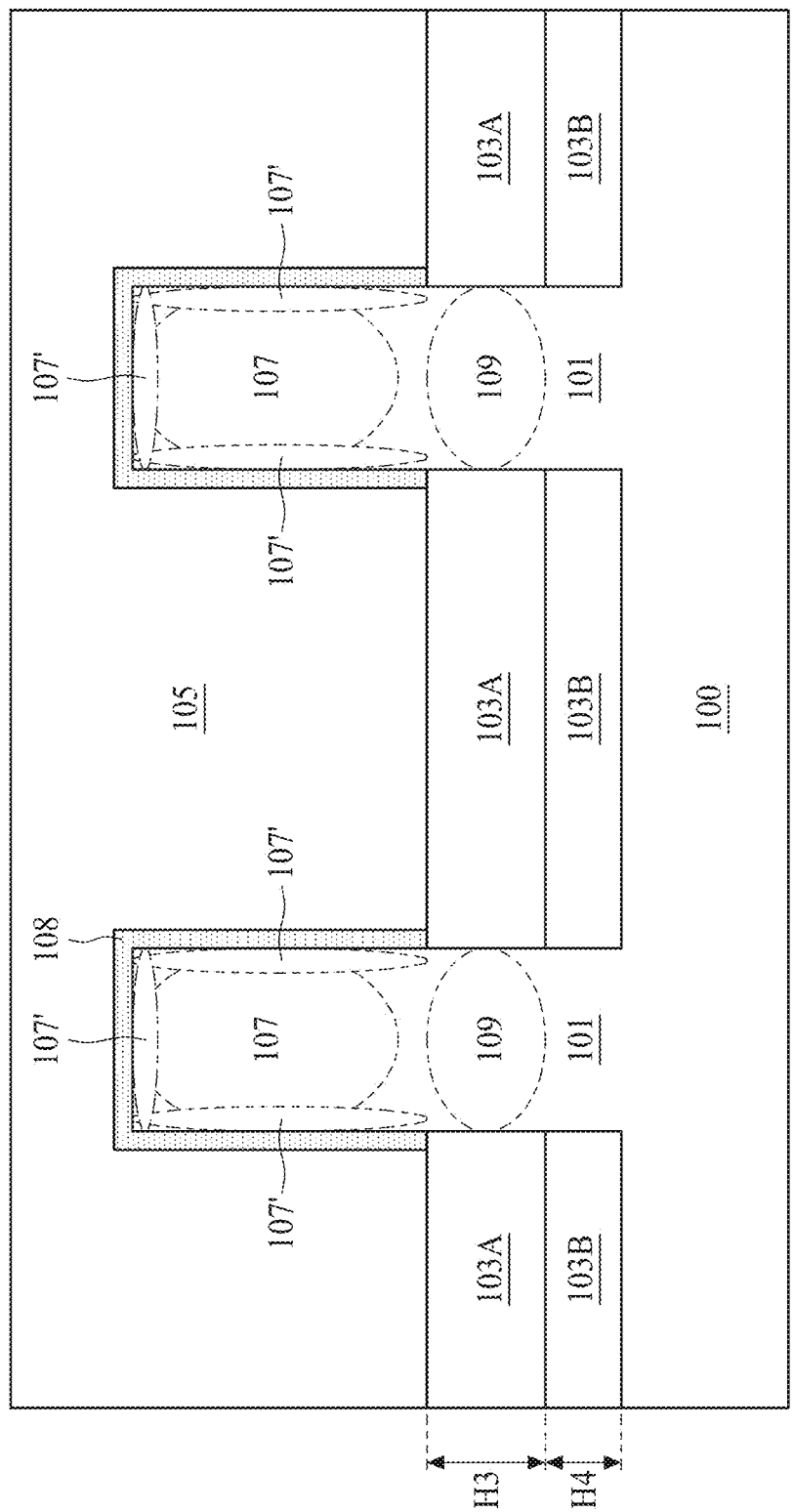
FIG. 3 shows a cross sectional view of a FinFET structure, in accordance with some embodiments of the present disclosure.

FIG. 3 shows a cross sectional view of a FinFET structure according some embodiments of the present disclosure. The cross sectional view in FIG. 3 can be dissected along line AA of FIG. 1 in some FinFET structure of the present disclosure. The fins 101 include a first portion (107, 107') and a second portion 109 under the first portion, and the second portion 109 is surrounded by the insulating layer 103A. Compared to FIG. 2, the first portion shown in FIG. 3 includes not only a bulk (107) of the fin but also a top surface and sidewalls (107') of the fin. In other words, the bulk, the top surface, and sidewalls of the fin 101 all possess a dopant concentration lower than about $1E17/cm^3$. In some embodiments, the top surface and sidewalls (107') of the fin are the channel region of the FinFET structure.

The second portion 109 of the fin shown in FIG. 3 resides between an upper layer 103A of the insulating layer. In some embodiments, a dopant concentration in the second portion 109 is at least two orders greater than the dopant concentration in the first portion (107, 107'). For example, the second portion 109 of the fin possesses a dopant concentration greater than about $5E18/cm^3$, whereas the first portion (107, 107') of the fin possesses a dopant concentration lower than about $1E17/cm^3$. An upper and a lower boundary of the second portion 109 substantially match with the upper and lower surface of the adjacent upper layer 103A of the insulating layer. In some embodiments, a height H3 of the upper layer 103A is determined according to an intended thickness of the second portion 109. For example, the height H3 can be in a range of from about 70 nm to about 90 nm. The lower layer 103B, as previously described in FIG. 2, may possess a height H4 of from about 5 nm to about 15 nm. In some embodiments, the second portion 109 of the fin is a well region of the FinFET structure.

Figure 4:
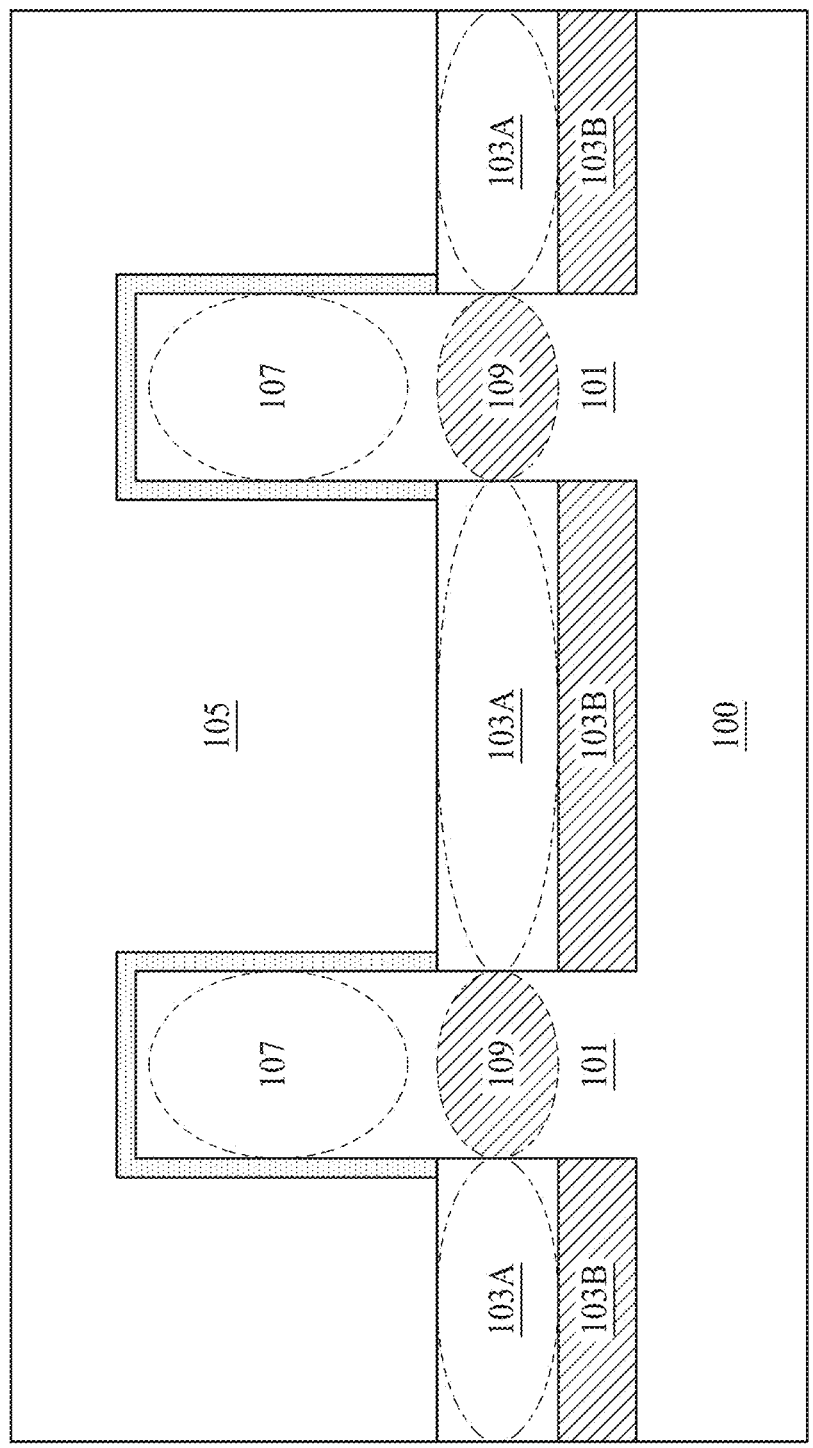
FIG. 4 shows a cross sectional view of a FinFET structure, in accordance with sonic embodiments of the present disclosure.

Referring to FIG. 4, the second portion 109 and the lower layer 103B are shaded with oblique lines. In some embodiments, the second portion 109 and the lower layer 103B possess substantially identical dopant concentration. For example, in the order of $5E18/cm^3$. In some embodiments, the first portion 108 and the upper layer 103A possess substantially identical dopant concentration. For example, in the order of $1E17/cm^3$.

Figure 5:
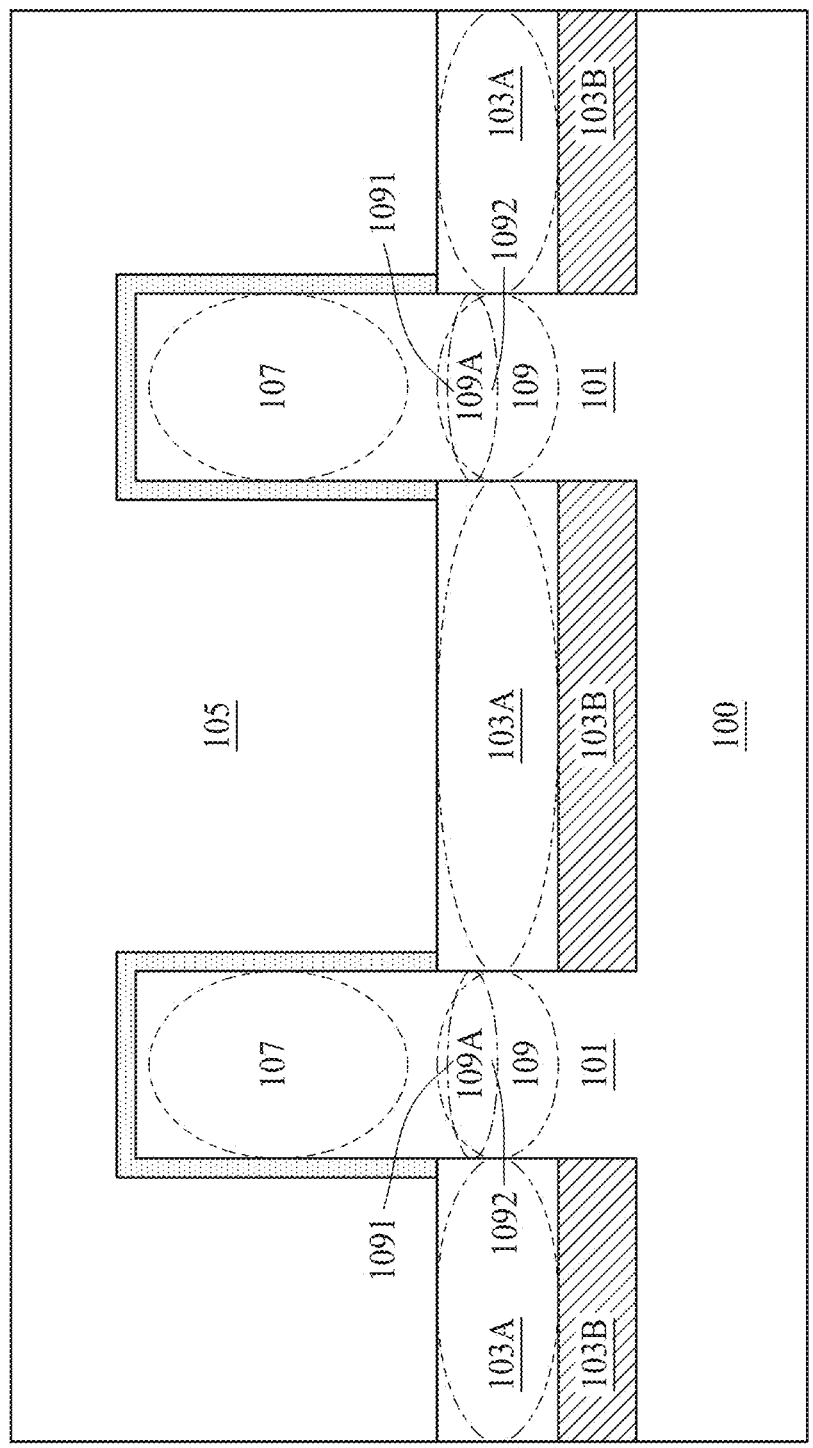
FIG. 5 shows a cross sectional view of a FinFET structure, in accordance with some embodiments of the present disclosure.

Referring to FIG. 5, the FinFET structure further includes a heavier-doped region 109A in the second portion 109. The dopant concentration in the heavier-doped region 109A is at least one order of magnitude greater than the dopant concentration in the second portion 109. For example, the heavier-doped region 109A possesses a dopant concentration greater than about $1E19/cm^3$. The heavier-doped region 109A is positioned below an interface 104 between the first portion 107 and the second portion 109, and resided in an upper part of the second portion 109. In some embodiments, the dopant concentration in the heavier-doped region 109A is uniformly distributed such that the dopant concentration measured at a top 1091 and a bottom 1092 of the heavier-doped region 109A is substantially identical. Alternatively stated, a dopant concentration difference between the top 1091 and the bottom 1092 of the heavier-doped region 109A is less than about 3%. In sonic embodiments, the heavier-doped region 109A is a middle well region or an anti-punch through region in a FinFET structure.

Figure 6:
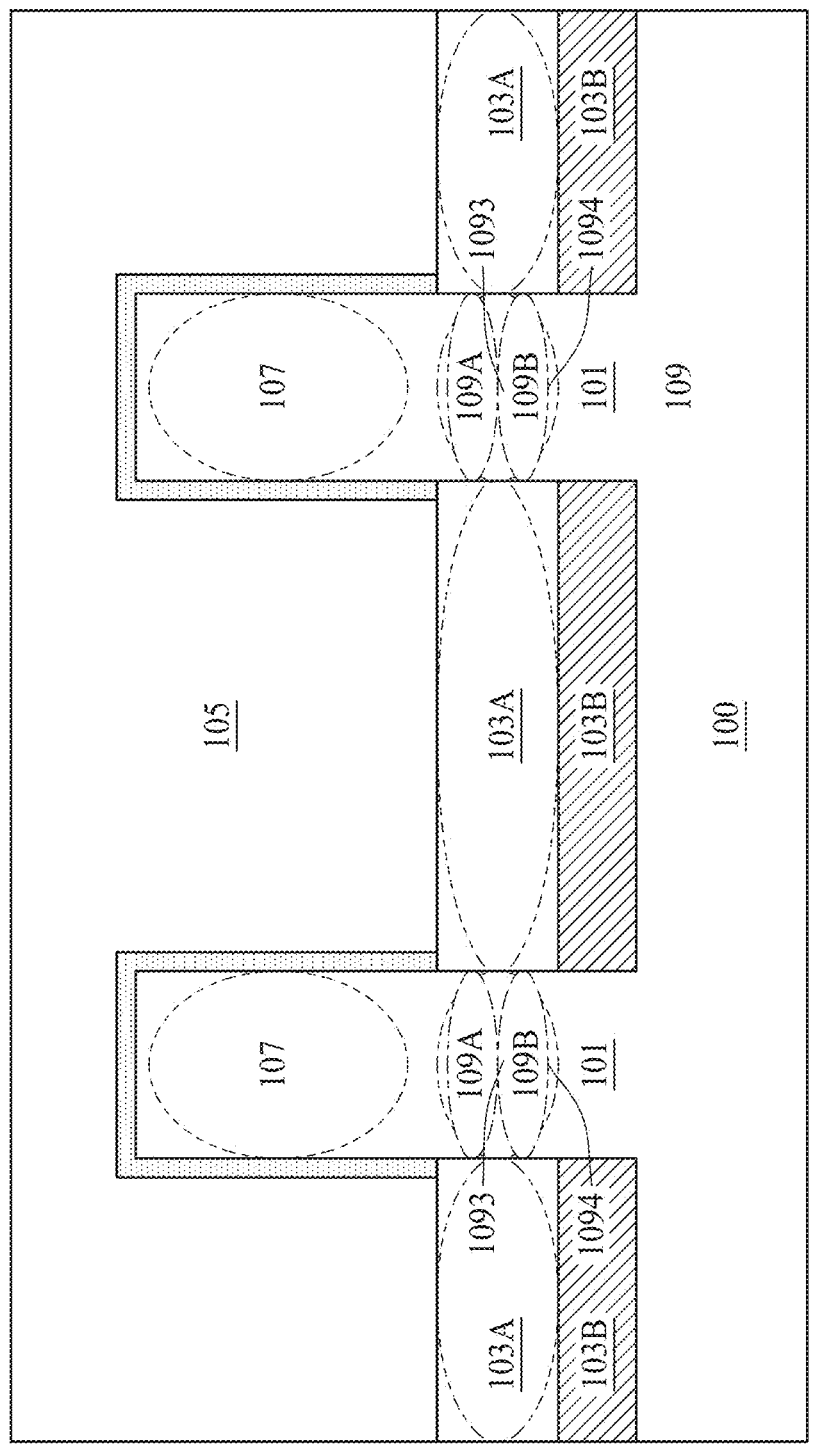
FIG. 6 shows a cross sectional view of a FinFET structure, in accordance with some embodiments of the present disclosure.

Referring to FIG. 6, the FinFET structure further includes a lighter-doped region 109B in the second portion 109. The dopant concentration in the lighter-doped region 109B is at least one order of magnitude lower than the dopant concentration in the heavier-doped region 109A. For example, the lighter-doped region 109B possesses a dopant concentration in an order of $5E18/cm^3$. The lighter-doped region 109B is positioned below the heavier-doped region 109A and is a part of the second portion 109 as shown in FIG. 3. In some embodiments, the dopant concentration in the lighter-doped region 109B is uniformly distributed such that the dopant concentration measured at a top 1093 and a bottom 1094 of the lighter-doped region 109B is substantially identical. Alternatively stated, a dopant concentration difference between the top 1093 and the bottom 1094 of the lighter-doped region 109B is less than about 5%.

Figure 7:
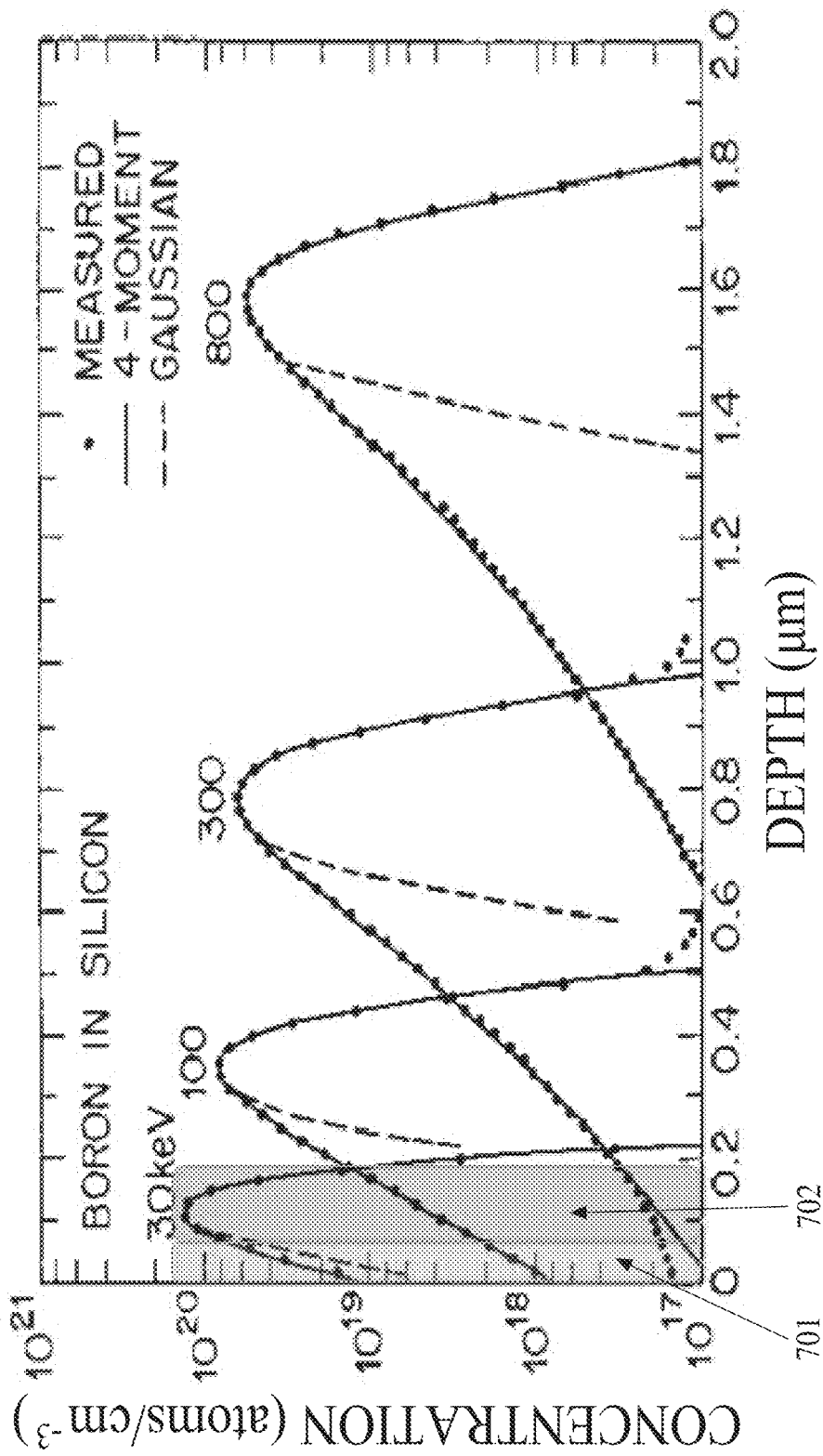
FIG. 7 shows operations of a method for manufacturing a FinFET structure, in accordance with embodiments of the present disclosure.

Referring to FIG. 5, FIG. 6 and FIG. 7, FIG. 7 is a diagram showing dopant concentration (atoms/$cm^3$) at various depths (μm) of the fin under specific implant energies. The depths are perpendicularly measured from a top surface of the fin. The curves showing the relation between the dopant concentration and the depth appear to have a Gaussian tail at the deeper side of the curve. Under fin top implantation, the lighter-doped region 109B in FIG. 6 follows the 702 portion of the 30 KeV curve, whereas the light-doped region 109A in FIG. 6 follows the 702 portion of the same curve. The lighter-doped region 109B prepared by fin top implantation demonstrates a concentration distribution indicated by the 701 portion of the 30 KeV curve. In this case, dopant concentrations at the top 1093 and the bottom 1094 of the lighter-doped region 109B are different, at least a 4 to 6 time discrepancy can be observed. Similarly, the heavier-doped region 109A prepared by fin top implantation demonstrates a concentration distribution indicated by the 701 portion of the 30 KeV curve. In this case, dopant concentrations at the top 1091 and the bottom 1092 of the heavier-doped region 109A in FIG. 5 are different, at least a 4 to 6 time discrepancy can be observed. By using the fin top implantation, the dopant concentration distribution follows the curves shown in FIG. 7, and thus the dopant concentration varies along the direction of the fin depth.

Particularly in the heavier-doped region 109A of the fin, dopant uniformity is crucial regarding suppressing the short channel effect. The method for manufacturing the FinFET structure described in the present disclosure is able to solve the low dopant uniformity problem as previously described.

Figure 8:
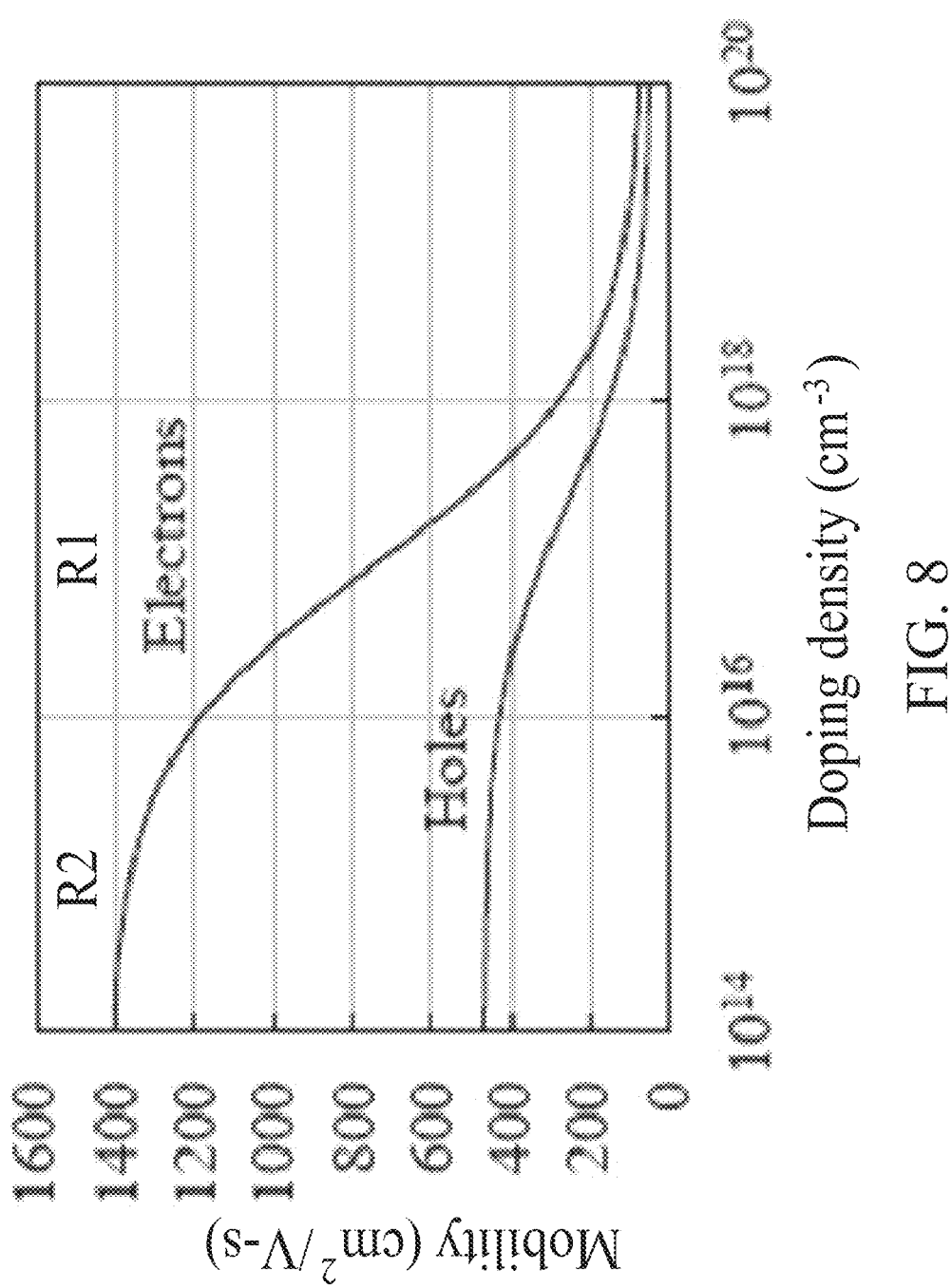
FIG. 8 is a diagram showing relations between dopant concentrations and depth of implantation under predetermined implant energy, in accordance with some embodiments of the present disclosure.

Referring to FIG. 3 and FIG. 8, FIG. 8 is a diagram showing carrier mobility ($cm^2/V \cdot s$) as a function of doping density ($cm^{-3}$). By using the fin top implantation, a majority of the high energy dopants travel through the first portion 107 and stop at the second portion 109 of the fin, however, a minority of the dopants can stop in the first portion 107, forming ionized scattering center in the first portion 107. Lattice integrity can also be deteriorated by the travelling of the high energy dopants, leading to implant induced lattice defects and dopant cluster. The scattering centers in the first portion 107, including the top surface and sidewalls (i.e. channel region 107'), of the fin are increased. In FIG. 8, the fin top implantation may create unintended background dopant density between $1E16/cm^3$ and $1E18/cm^3$ (as shown in region R1 of FIG. 8) at the first portion 107. The resulting electron mobility in an N-type FinFET structure can be in a range of from 1200 $cm^2/V \cdot s$ to about 300 $cm^2/V \cdot s$, The method provided in the present disclosure can suppress the doping density under $1E17/cm^3$, or even under $1E16/cm^3$ (as shown in region R2 of FIG. 8). In this case, the electron mobility in the first portion 109 including the top surface and sidewalls (i.e. channel region 107'), of the fin can be controlled to be greater than about 1200 $cm^2/V$.

Figure 9:
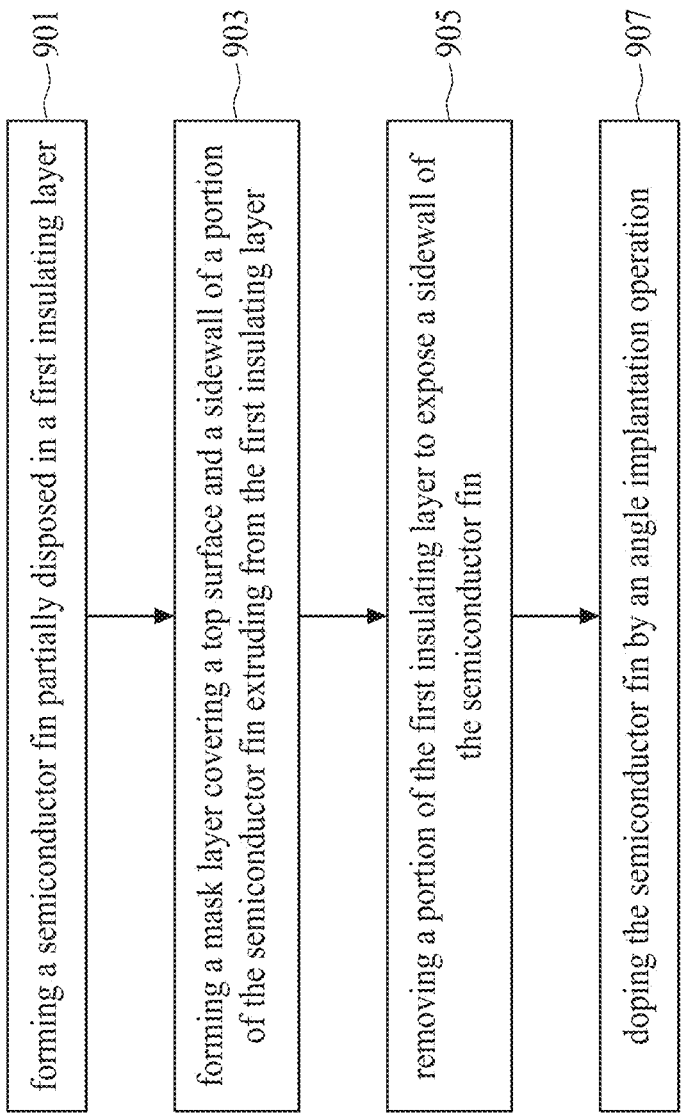
FIG. 9 is a diagram showing relations between carrier mobility and the doping density, in accordance with some embodiments of the present disclosure.
Figure 10:
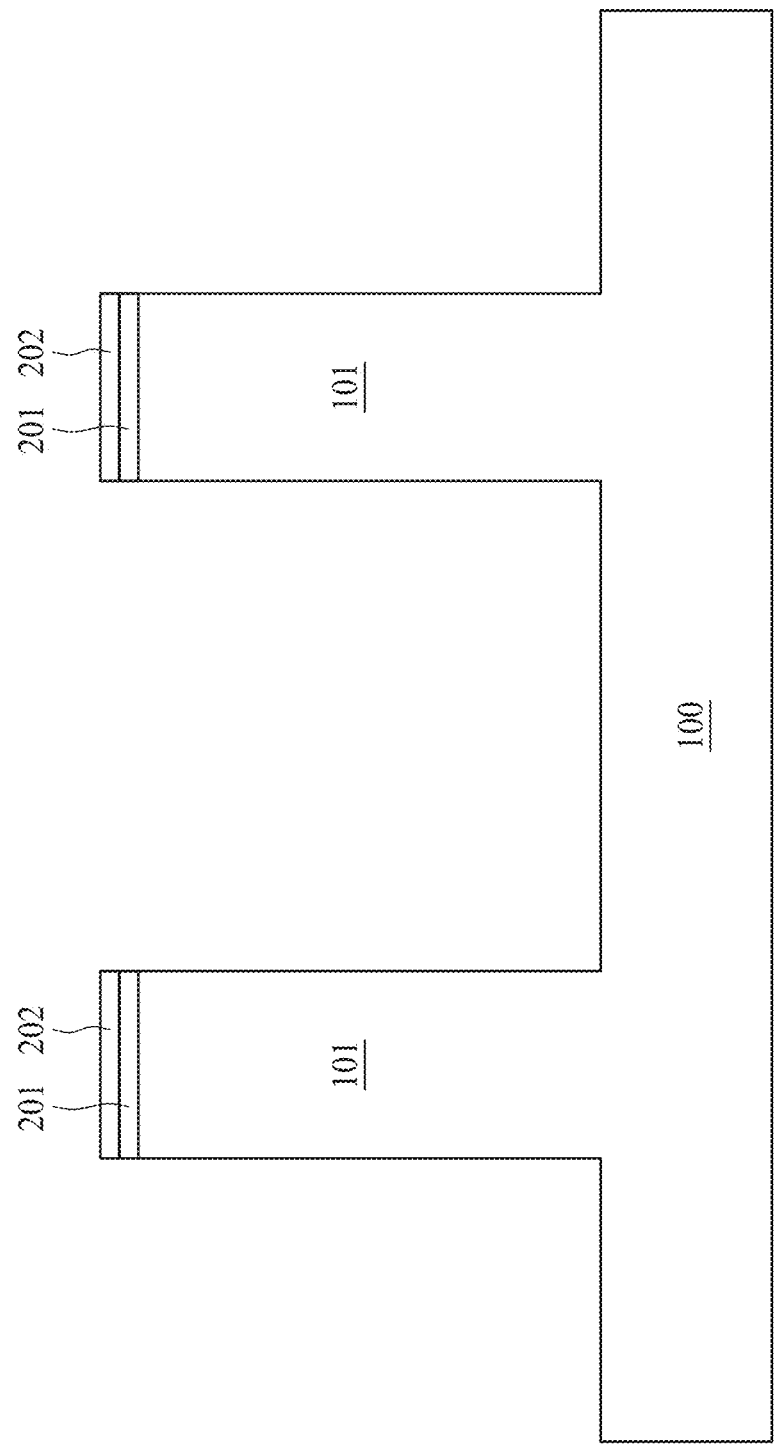
FIG. 10 to FIG. 22 show cross sectional views in operations for manufacturing a FinFET structure, in accordance with some embodiments of the present disclosure.
Figure 11:
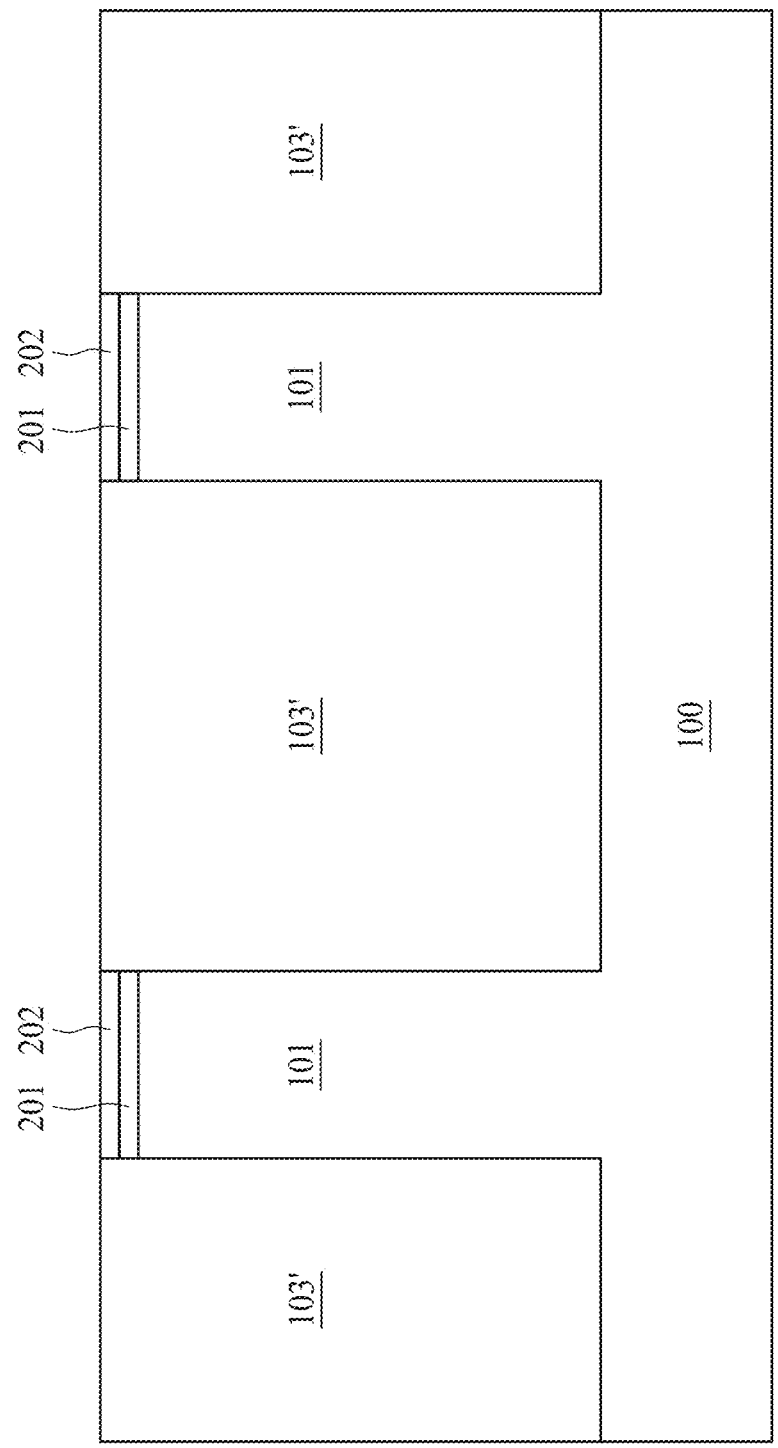
Figure 12:
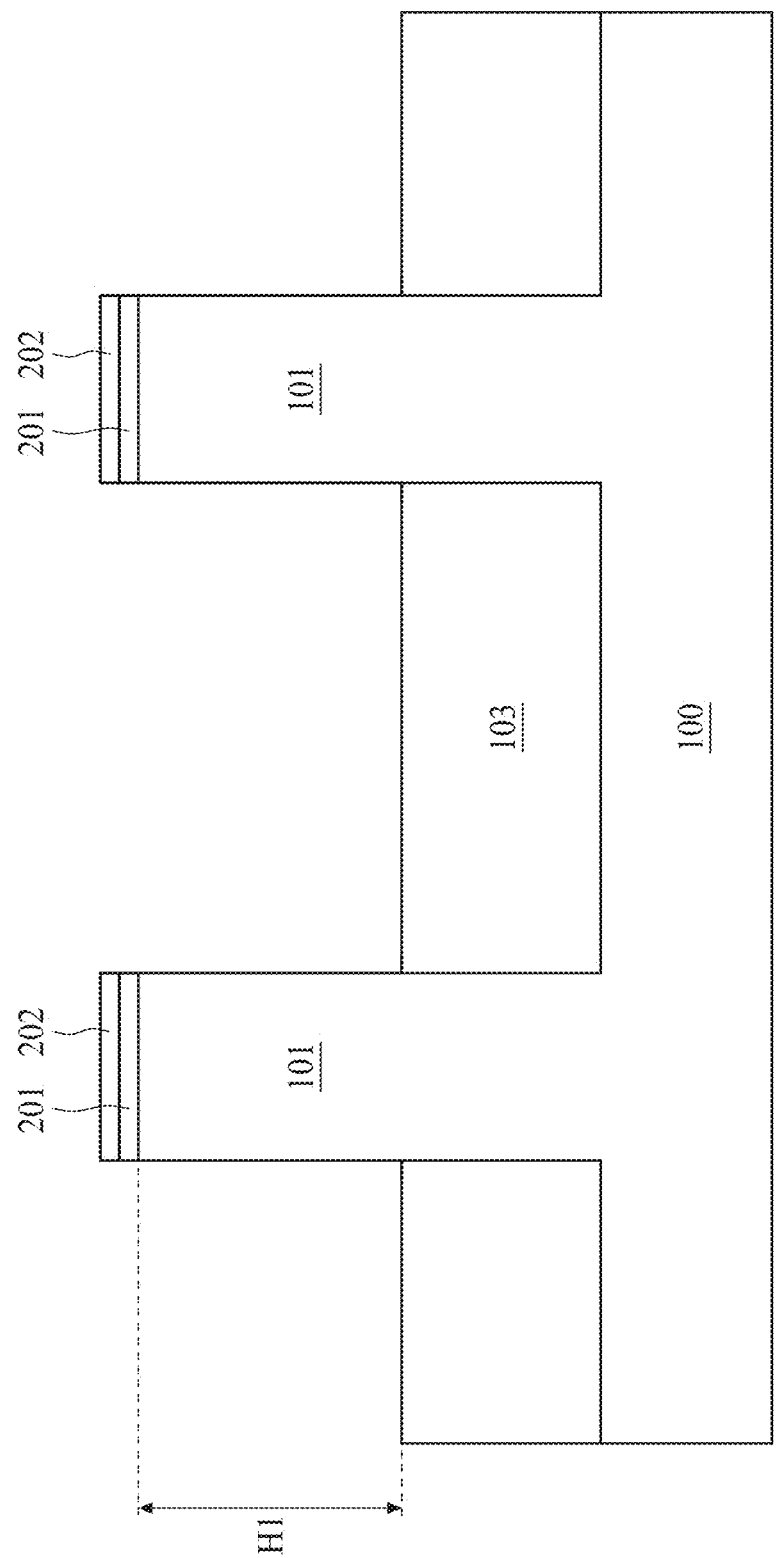

Referring to FIG. 9, operations of the method for manufacturing a FinFET structure of the present disclosure is provided. Operations in FIG. 9 are further described along with the description of FIG. 10 to FIG. 21. FIG. 10 to FIG. 21 show cross-sectional views of operations in a method described herein. In operation 901 and FIG. 10 to FIG. 12, a semiconductor fin 101 is formed to be partially disposed in a first insulating layer 103'. In FIG. 10, a semiconductor substrate 100 covered with a multilayer is etched to form two fins 101. In some embodiments, the multilayers may include an oxide layer 201 and a nitride layer 202. The oxide layer 201 can be a pad oxide layer in an I/O region of an integrated circuit. In other embodiments, additional layers can be included in the multilayers. The multilayers are remained over the top of the fins 101 as hard mask for subsequent operations. In FIG. 11, a first insulating layer 103' is deposited over the semiconductor substrate 100 and the fins 101. A planarization operation may be performed to level a top surface of the first insulating layer 103' with the multilayer. In FIG. 12, the first insulating layer 103' is removed to a predetermined depth, exposing a portion of the fins 101 extruding from the etched first insulating layer 103. In some embodiments, the exposed fins 101 possess a height H1 of from about 30 nm to about 50 nm.

Figure 13:
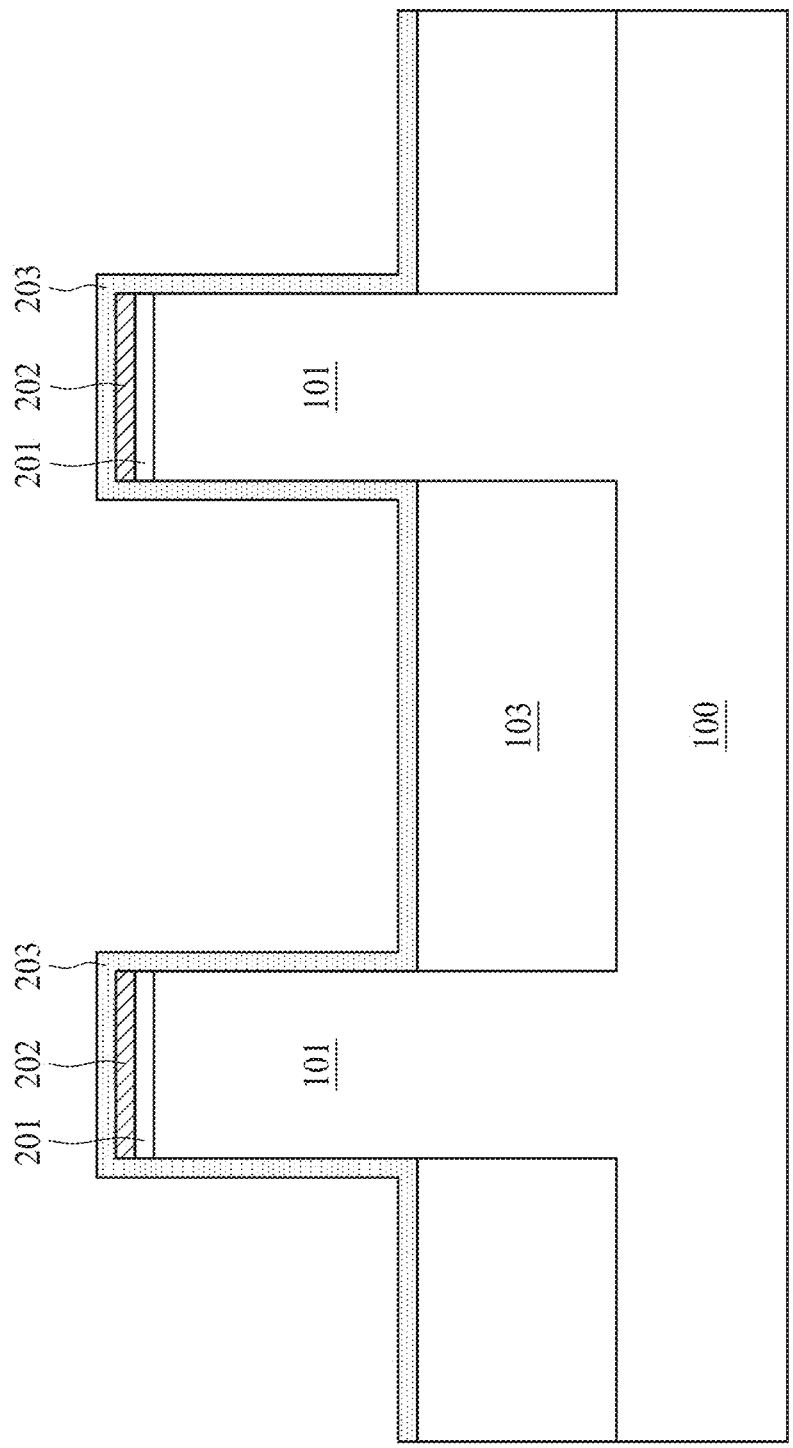
Figure 14:
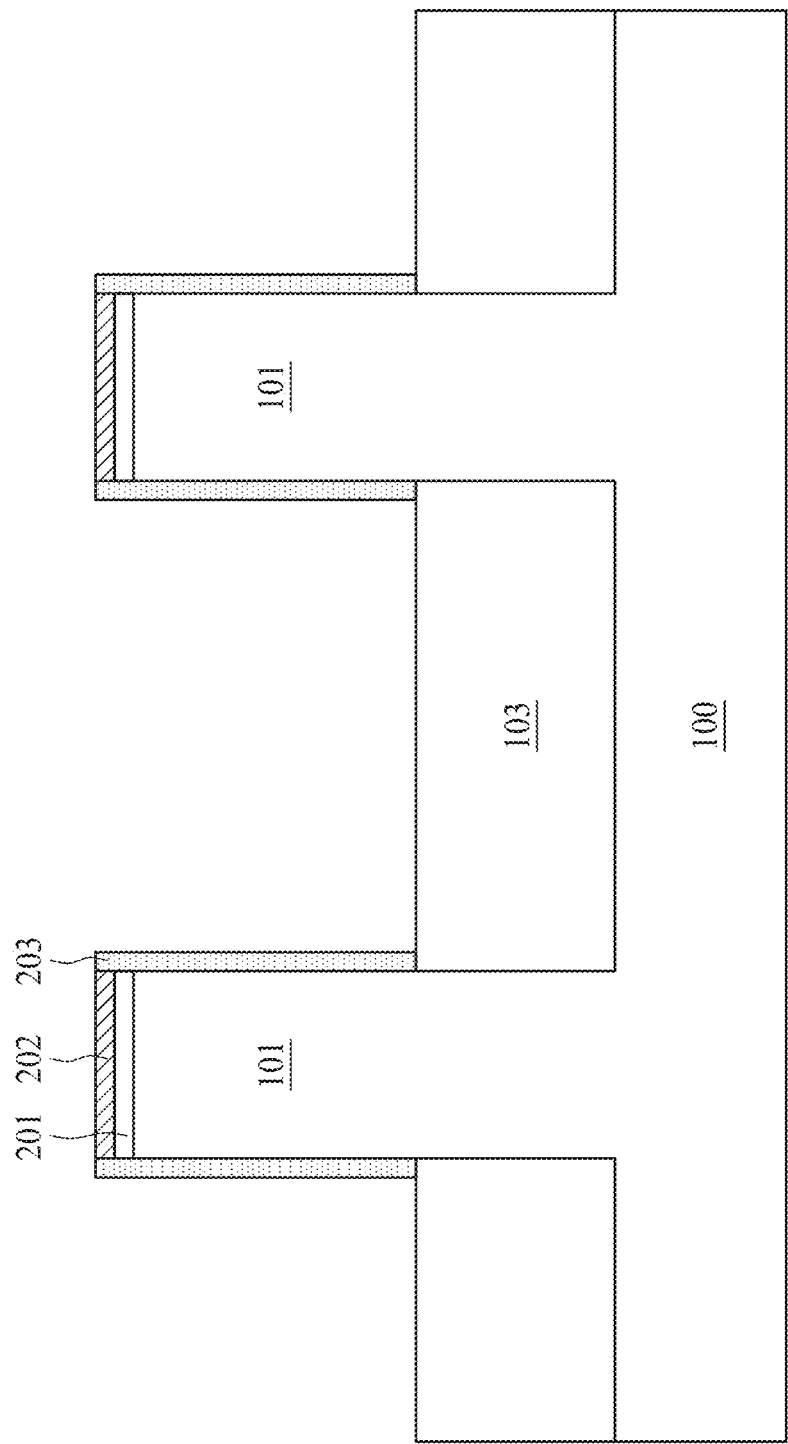

Referring to operation 903 and FIGS. 13, 14. In FIG. 13, a mask layer 203 is formed to cover the top surface and sidewalls of the fins 101 exposed from the etched first insulating layer 103. In some embodiments, the mask layer 203 is blanket deposited to conformably cover the fins 101 and the etched first insulating layer 103. In some embodiments, the mask layer 203 can be a nitride layer. In FIG. 14, a directional etch or a dry etch is applied to remove a portion of the mask layer 203 over the top surface of the fin 101 and the top surface of the etched first insulating layer 103. Etched mask layer 203 covering sidewalls of the fins 101 are preserved after the directional etch operation.

Figure 15:
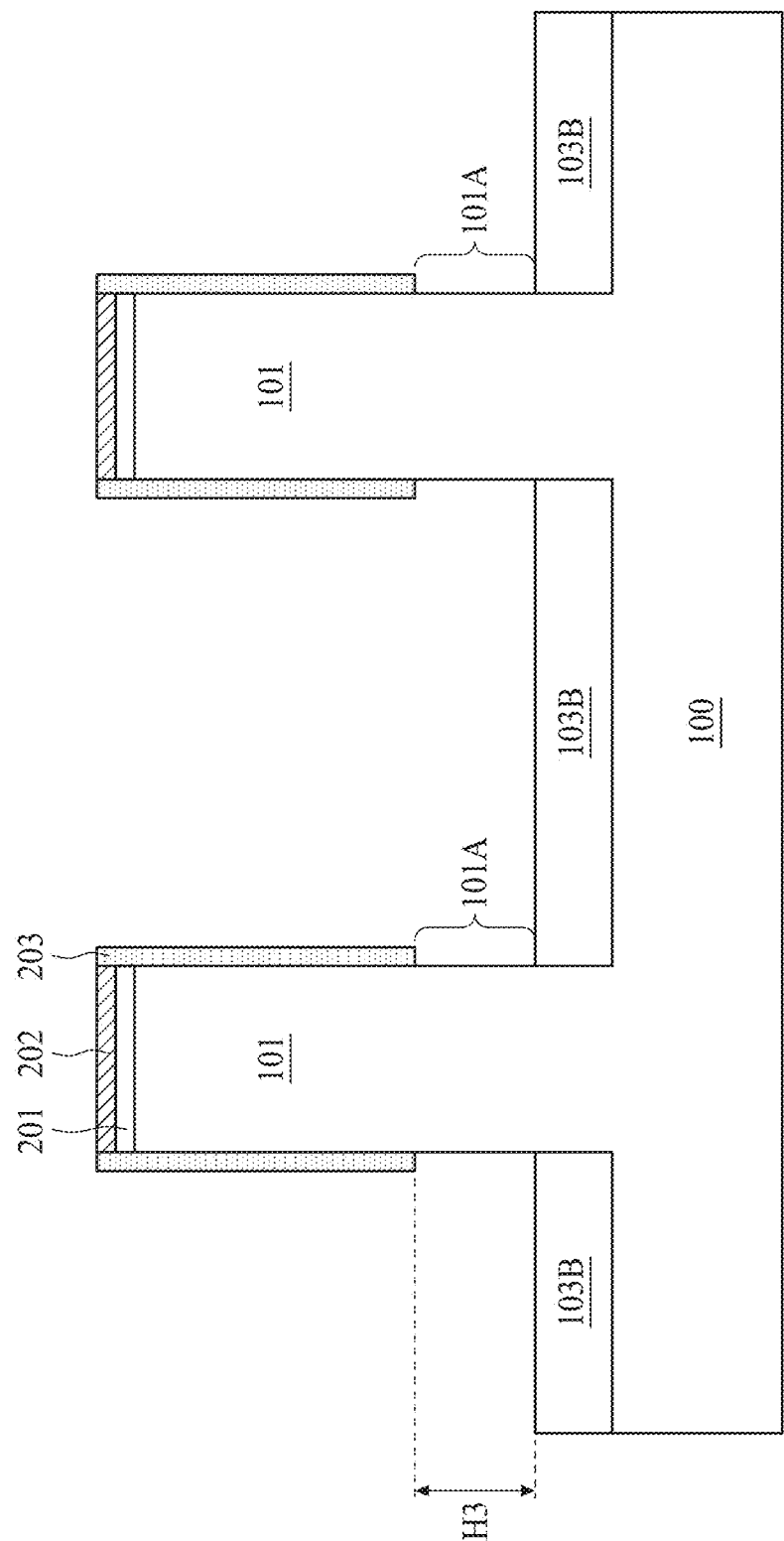

Referring to operation 905 and FIG. 15, an upper portion of the etched first insulating layer 103 is removed to a predetermined depth, exposing portion of sidewalls 101A of the fins 101. The exposed portion of the sidewalls 101A is not covered by the mask layer 203. In some embodiments, the exposed portion of the sidewalls 101A possesses a height H3 of about 60 nm to about 100 nm. The first insulating layer 103 is denoted as 103B in FIG. 15 since it has been etched at least in two operations illustrated in FIG. 12 and FIG. 15. In FIG. 15, although the mask layer 203 over the top surface of the fins 101 is removed in previous operation, the multilayers serves as a hard mask in the etching operation of the first insulating layer 103, such that the bulk of the fin 101 is not damaged in the present operation.

Figure 16:
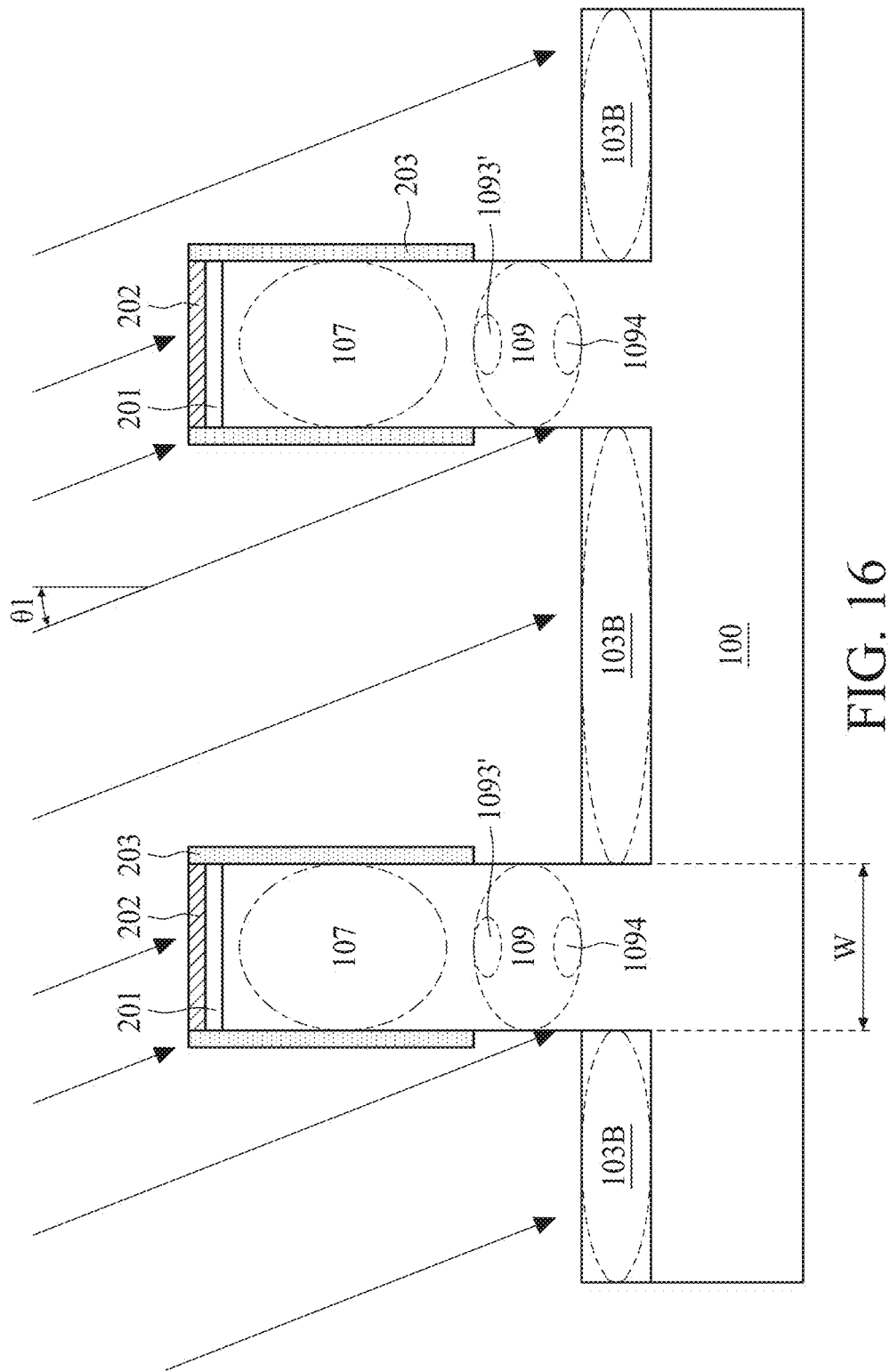
Figure 17:
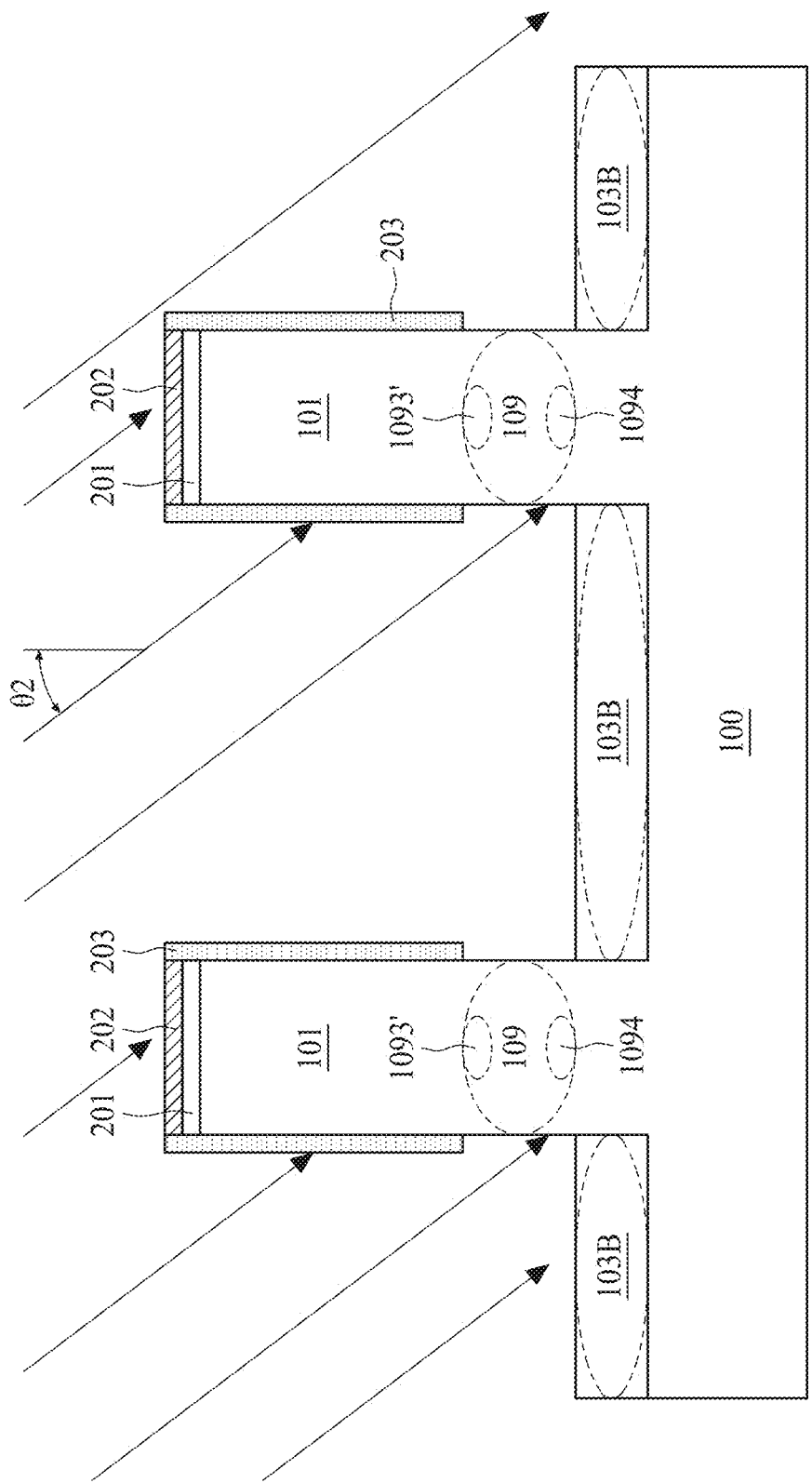
Figure 18:
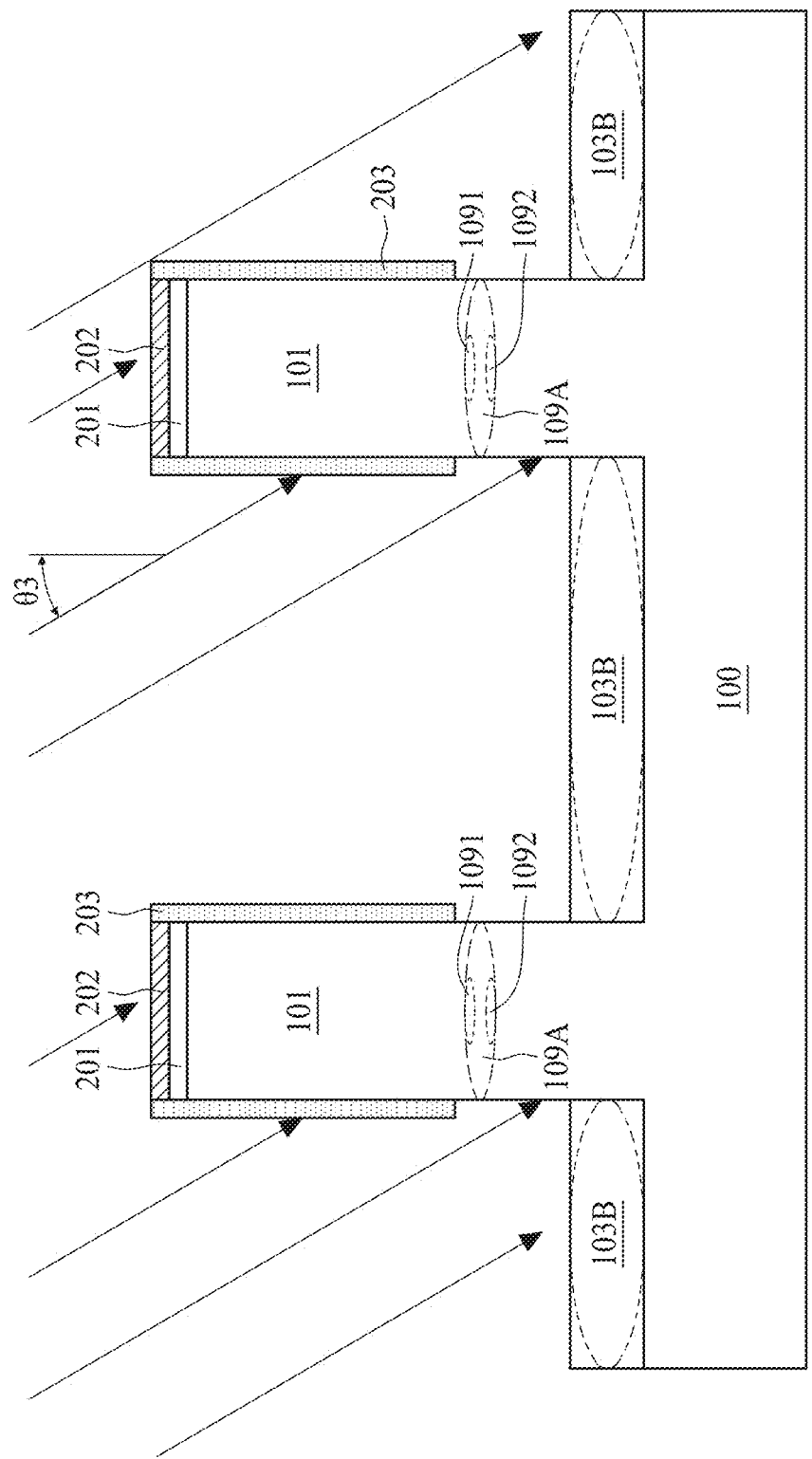

Referring to operation 907 and FIGS. 16, 17, 18. A tilted angle implantation is carried out to form a second portion 109, or a well portion, of the semiconductor fins 101. The tilted angle of the implantation operation can be in a range of from about 5 to about 45 degrees. In FIG. 16, ion beams are controlled to implant dopants from an angle θ1 tiled from a vertical line. In some embodiments, θ1 is about 10 degrees. As described previously, a width W of the fins 101 is in a range of from about 5 nm to 10 nm, and hence the effective depth with respect to the high energy dopant is half of the fin width W, that is, from about 2.5 nm to about 5 nm. In the fin top implantation, the high energy dopant has to penetrate through the first portion 107 of the fin then arrive at the second portion 109, hence the implant energy in the fin top implantation is averagely 30 KeV to 80 KeV. However, after the removal of a portion of the mask layer 203 and expose sidewalls 101A of the fins 101 in the present disclosure, the dopant to be implanted no longer need to possess high energy, instead, in some embodiments, implant energy of 1 KeV or below is sufficient to form the well portion 109 of the fin. Referring back to FIG. 7, the Gaussian distribution of the dopant concentration can hardly be observed due to the effective depth for the dopant to travel substantially decreases. The dopant concentration in the well region 109 achieves high uniformity. Alternatively stated, dopant concentrations at a top 1093' and a bottom 1094 of the well region 109 are substantially identical.

In FIG. 17, ion beams are controlled to implant dopants from an angle θ2 tiled from a vertical line. In some embodiments, θ2 can be in a range of from about 5 to about 25 degrees. Compared to FIG. 16 where the angle θ1 is only 10 degrees, dopants impinging the fin from the angle θ2 perceive even shorter effective depth. The implant energy used with angle θ2 may be lower than the implant energy used with angle θ1. Similarly, dopant concentrations at a top 1093' and a bottom 1094 of the well region 109 are substantially identical. In FIG. 18, ion beams are controlled to implant dopants from an angle θ3 tiled from a vertical line. In some embodiments, θ3 is about 30 degrees. A mid well region or an anti-punch through (APT) region 109A is formed in the scheme of FIG. 18. The dose of the APT implant is higher than that used in the well implant such that the APT region is heavier-doped than the well region. Similarly, dopant concentrations at a top 1091 and a bottom 1092 of the APT region 109A are substantially identical.

Figure 19:
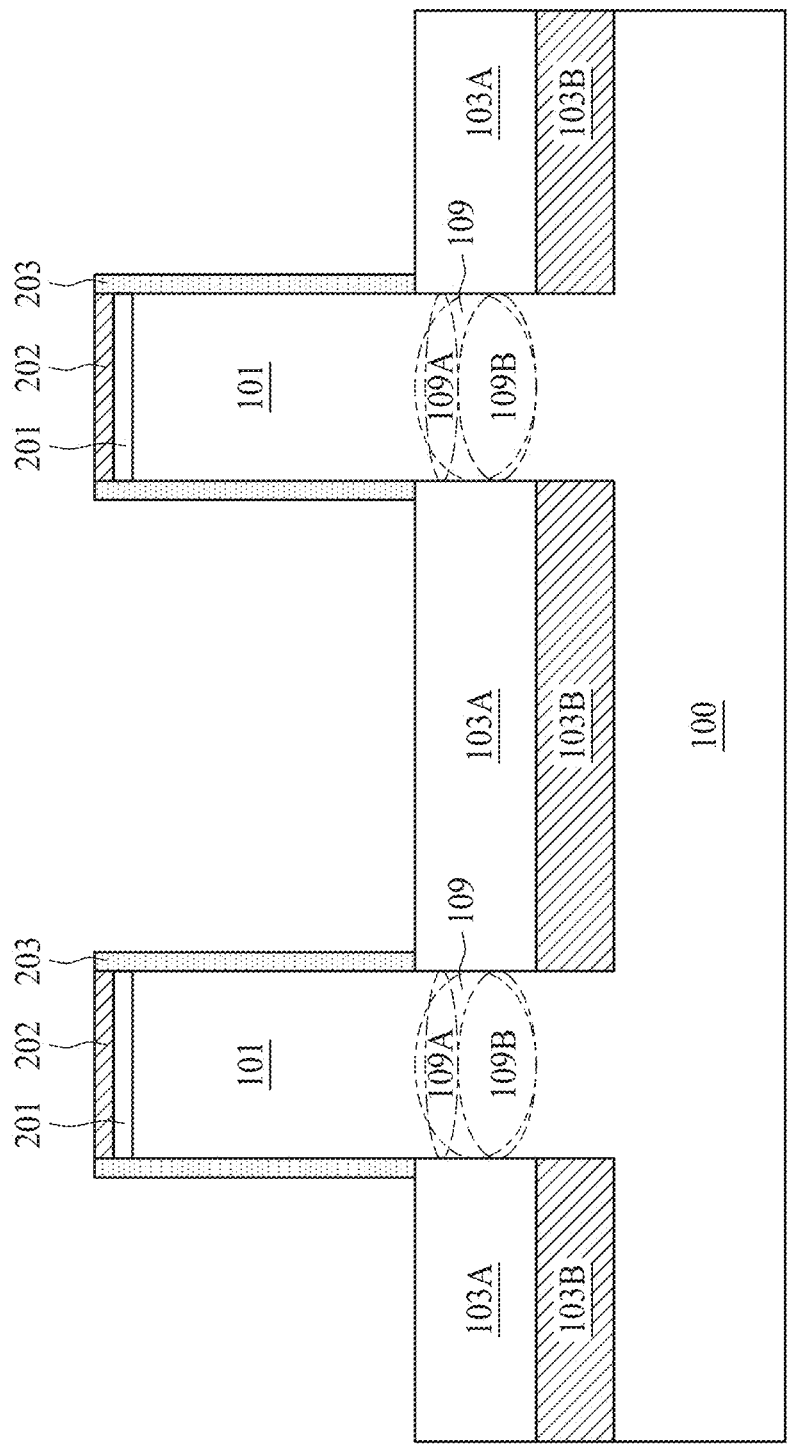

Noted in FIG. 16 to FIG. 18, as the well region 109 or the APT region 109A is doped, the first insulating layer 103B is also doped without any shielding. The first insulating layer 103B is thus a doped region with a dopant concentration of at least $1E19/cm^3$. In FIG. 19, a second insulating layer 103A is deposited over the first insulating layer 103B. Since no subsequent implant operation, the second insulating layer 103B is essentially undoped. Because the first insulating layer 103B and the second insulating layer 103A are formed at different operations, an interface separating an upper undoped portion and a lower doped portion may be located. In FIG. 19, the second portion 109 includes an APT region 109A and a well region 109B. The two regions can be identified using SIMS according to different dopant concentrations previously described.

Figure 20:
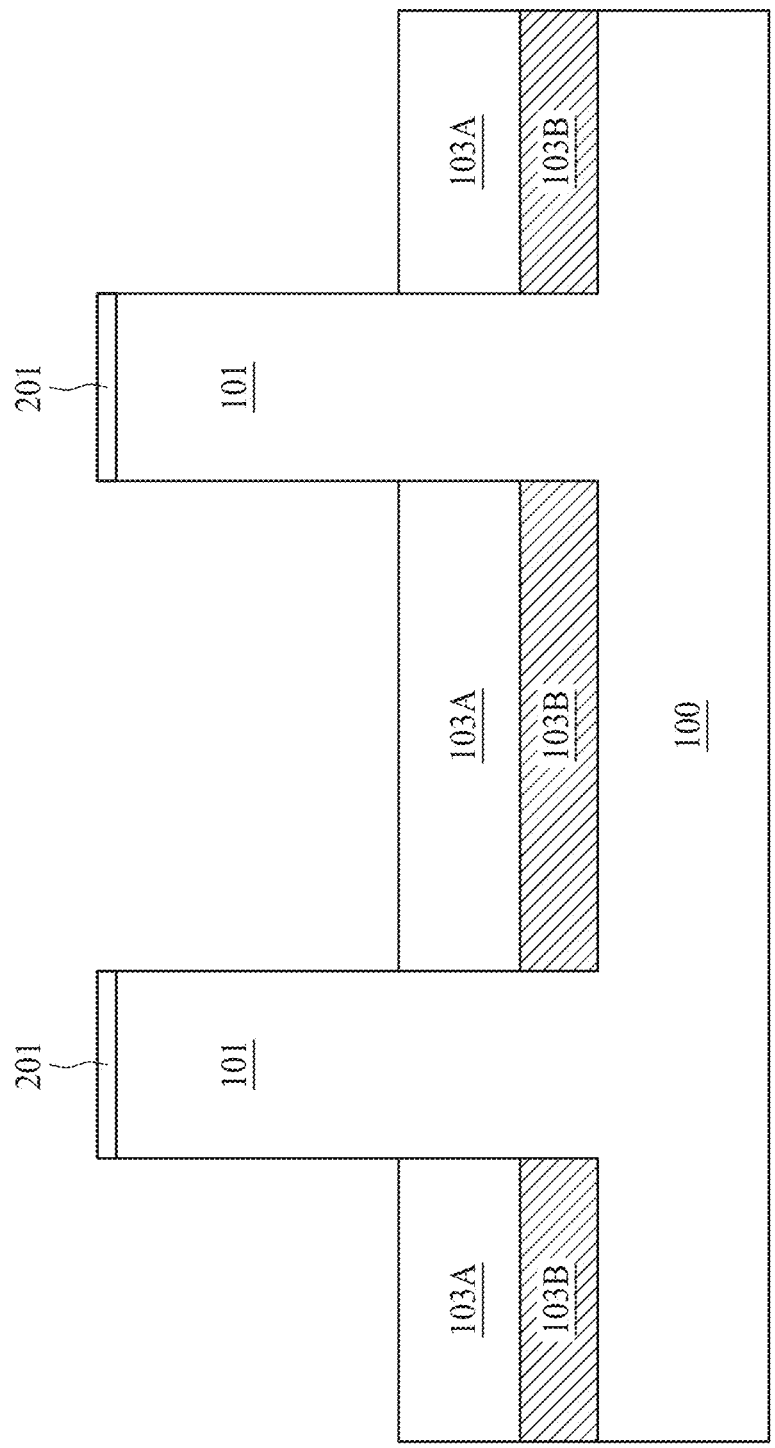
Figure 21:
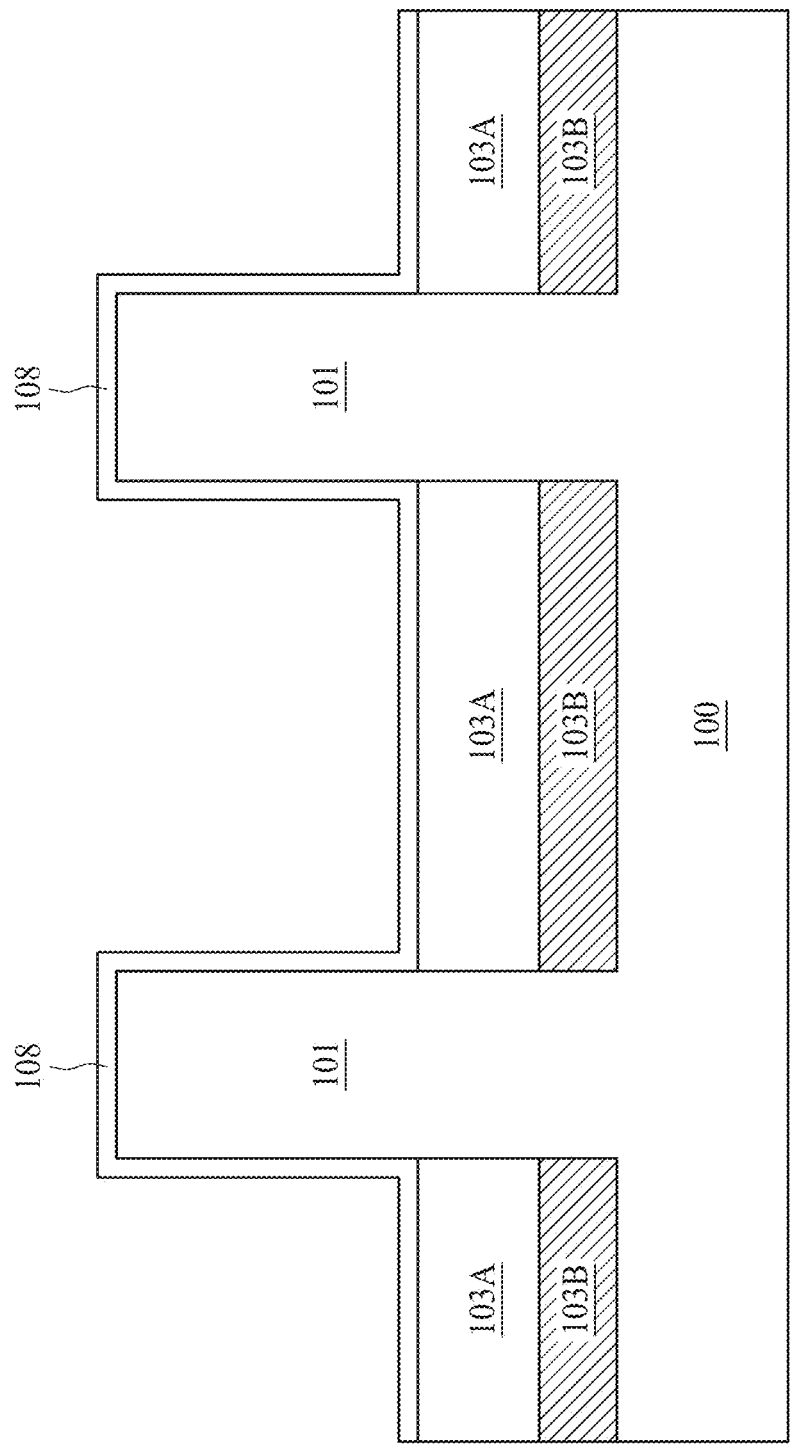
Figure 22:
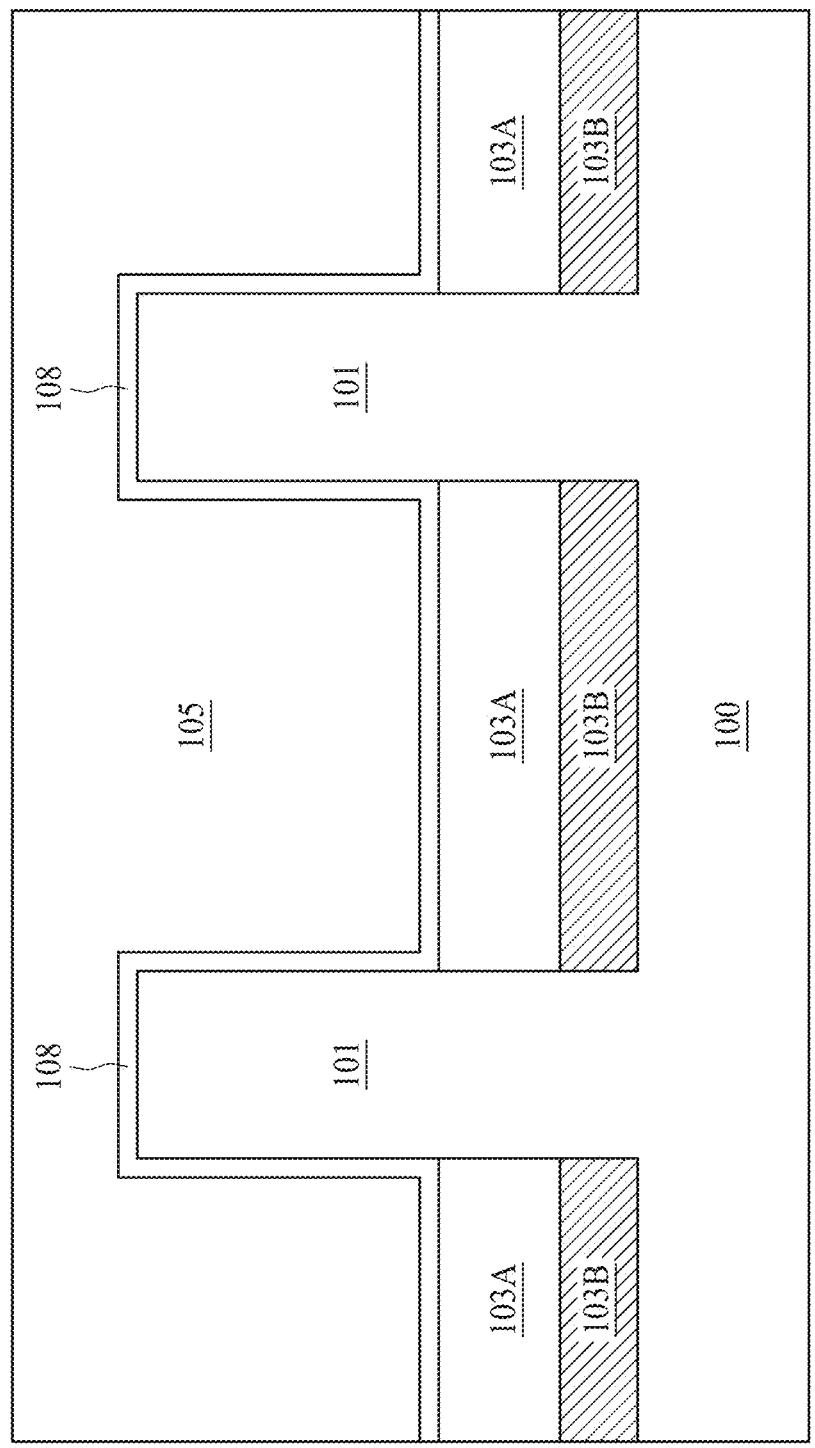

In FIG. 20, the mask layer 203 is removed by a wet etch operation. In some embodiments, the nitride layer 202 of the multilayer over the fins 101 is also removed in the present operation. As a result, the oxide layer 201 of the multilayer is exposed. If the FinFET structure resides in an I/O region of an integrated circuit (IC), the oxide layer 201 may be preserved as a pad oxide layer. If the FinFET structure resides in other regions of the IC, the oxide layer 201 can be removed, and redeposit a high-k dielectric layer 108, as shown in FIG. 21. In FIG. 22, a metal gate 105 is formed to cover the fins 101 and the insulating layers 103A, 103B.

The present disclosure provides a FinFET structure having a dopant-free channel region, a uniformly-doped well region, and a uniformly-doped APT region. A method for manufacturing such FinFET structure is also disclosed. The FinFET structure described herein achieves better carrier mobility and can better suppress the short channel effect.

Present disclosure provides a FinFET structure. The FinFET structure includes a fin and a gate surrounding a first portion of the fin. A dopant concentration in the first portion of the fin is lower than about $1E17/cm^3$.

In some embodiments of the present disclosure, the FinFET structure further includes an insulating layer surrounding a second portion of the fin. The dopant concentration of the second portion of the fin is greater than about $5E18/cm^3$.

In some embodiments of the present disclosure, the FinFET structure further includes an insulating layer surrounding a second portion of the fin. The insulating layer includes a lower layer and an upper layer, and the lower layer is disposed over a substrate connecting to the fin and has a dopant concentration greater than about $1E19/cm^3$.

In some embodiments of the present disclosure, the FinFET structure further includes an insulating layer surrounding a second portion of the fin. The insulating layer includes a lower layer and an upper layer. The upper layer is disposed over the lower layer and has a dopant concentration lower than about $1E17/cm^3$.

In some embodiments of the present disclosure, the second portion of the fin further includes a heavier doped region in proximity to an interface of the first portion and the second portion of the fin. Dopant concentrations at a top and a bottom of the heavier doped region are substantially identical.

In some embodiments of the present disclosure, the dopant concentration of the heavier doped region is greater than about $1E19/cm^3$.

In some embodiments of the present disclosure, the second portion of the fin further includes a lighter doped region below the heavier doped region. Dopant concentrations at a top and a bottom of the lighter doped region are substantially identical.

Present disclosure provides a MOS structure. The MOS structure includes a fin and an insulating layer surrounding a well portion of the fin. A channel portion of the fin is extruding from the insulating layer. A dopant concentration in an upper portion of the insulating layer is substance lower than a dopant concentration in a lower portion of the insulating layer.

In some embodiments of the present disclosure, the dopant concentration of the upper portion is lower than about $1E17/cm^3$.

In some embodiments of the present disclosure, the channel portion is surrounded by a metal gate, and a dopant concentration of the channel region is lower than about $1E17/cm^3$.

In some embodiments of the present disclosure, the dopant concentration of the well portion is greater than about $5E18/cm^3$.

In some embodiments of the present disclosure, the well portion further includes an anti-punch through region in proximity to the channel portion. A concentration difference between a top and a bottom of the anti-punch through region is less than about 3%.

In some embodiments of the present disclosure, the upper portion and the lower portion of the insulating layer are two layers having an interface there between.

Present disclosure provides a method for manufacturing a FinFET structure. The method includes (1) forming a semiconductor fin partially disposed in a first insulating layer; (2) forming a mask layer covering a top surface and a sidewall of a portion of the semiconductor fin extruding from the first insulating layer; (3) removing a portion of the first insulating layer to expose a sidewall of the semiconductor fin; and (4) doping the semiconductor fin by an angle implantation operation.

In some embodiments of the present disclosure, the method further includes forming a second insulating layer over the first insulating layer.

In some embodiments of the present disclosure, the method further includes forming a multilayer comprising an oxide layer and a nitride layer over the top surface of the semiconductor fin.

In some embodiments of the present disclosure, the forming the mask layer covering the top surface and the sidewall of the portion of the semiconductor fin extruding from the first insulating layer includes blanket depositing a mask layer over the top surface and the sidewall of the portion of the semiconductor fin extruding from the first insulating layer.

In some embodiments of the present disclosure, the removing the portion of the first insulating layer to expose the sidewall of the semiconductor fin includes (1) removing the mask layer disposed over a top surface of the first insulating layer; and (2) etching a portion of the first insulating layer to a predetermined depth.

In some embodiments of the present disclosure, doping the semiconductor fin by a tilted angle implantation operation includes performing a small angle implantation at energy about or below about 1 KeV.

In some embodiments of the present disclosure, the method further includes removing the mask layer from the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a FinFET structure, comprising:
    forming a semiconductor fin that defines a channel region of a transistor, wherein the semiconductor fin has an upper portion extruding from a first insulating layer over a substrate;
    forming a mask layer covering the upper portion of the semiconductor fin;
    removing a portion of the first insulating layer to expose a lower portion of a sidewall of the semiconductor fin;
    doping the semiconductor fin by an angle implantation operation from the lower portion of the sidewall of the semiconductor fin exposed by removing the portion of the first insulating layer, wherein an upper portion of the sidewall of the semiconductor fin is covered by the mask layer during the angle implantation operation;
    after doping the semiconductor fin, forming a second insulating layer on the exposed lower portion of the sidewall of the semiconductor fin and over the first insulating layer, while the upper portion of the sidewall of the semiconductor fin is covered by the mask layer; and
    exposing the upper portion of the sidewall of the semiconductor fin by removing the mask layer after forming the second insulating layer.

2. The method of claim 1, further comprising forming a multilayer comprising an oxide layer and a nitride layer over the upper portion of the semiconductor fin.

3. The method of claim 1, wherein the forming the mask layer covering the upper portion comprises blanket depositing the mask layer over the upper portion of the semiconductor fin.

4. The method of claim 1, wherein the removing the portion of the first insulating layer to expose a lower portion of the sidewall of the semiconductor fin comprises:
    removing the mask layer disposed over a top surface of the first insulating layer; and
    etching a portion of the first insulating layer to a predetermined depth.

5. The method of claim 1, wherein the doping the semiconductor fin by the angle implantation operation comprises performing a tilted angle implantation at energy about or below about 1KeV.

6. The method of claim 1, wherein the forming the second insulating layer over the first insulating layer is performed after the angle implantation operation.

7. The method of claim 1, wherein the second insulating layer is essentially undoped.

8. The method of claim 1, further comprising forming a high-k dielectric layer over the upper portion and the lower portion of the sidewall of the semiconductor fin and a top surface of the second insulating layer after removing the mask layer.

9. The method of claim 1, wherein a height of the first insulating layer is in a range from 60 nm to 100 nm.

10. A method for manufacturing a FinFET structure, comprising:
    forming a semiconductor fin partially disposed in a first insulating layer on a substrate, wherein the semiconductor fin defines a channel region of a transistor;
    forming a mask layer covering an upper portion of the semiconductor fin, the upper portion extruding from the first insulating layer;
    removing a portion of the first insulating layer to expose a lower portion of a sidewall of the semiconductor fin;
    doping the semiconductor fin by an angle implantation operation from the lower portion of the sidewall of the semiconductor fin exposed by removing the portion of the first insulating layer, wherein an upper portion of the sidewall of the semiconductor fin is covered by the mask layer during the angle implantation operation;
    after doping the semiconductor fin, forming a second insulating layer on the exposed lower portion of the sidewall of the semiconductor fin and over the first insulating layer, while the upper portion of the sidewall of the semiconductor fin is covered by the mask layer, wherein a dopant concentration in the first insulating layer is greater than a dopant concentration in the second insulating layer, the first insulating layer being in direct contact with the substrate; and exposing the upper portion of the sidewall of the semiconductor fin by removing the mask layer after forming the second insulating layer.

11. The method of claim 10, wherein the sidewall of the semiconductor fin exposed by removing the portion of the first insulating layer comprises a height of from 30 nm to 50 nm.

12. The method of claim 10, further comprising:

removing a horizontal portion of the mask layer from the semiconductor fin and the first insulating layer after forming the mask layer covering the upper portion of the semiconductor fin.

13. The method of claim 12, wherein the forming the mask layer covering the upper portion of the semiconductor fin comprises: forming the mask layer conformably covering the upper portion of the semiconductor fin.

14. The method of claim 10, wherein the mask layer is removed from the upper portion of the semiconductor fin by an wet etch operation after removing the portion of the first insulating layer to expose the bottom portion of the sidewall of the semiconductor fin.

15. A method for manufacturing a FinFET structure, comprising:

forming a first insulating layer surrounding a lower portion of a semiconductor fin;

forming a mask layer over an upper portion of a sidewall of the semiconductor fin;

exposing a lower portion of the sidewall of the semiconductor fin by removing a portion of the first insulating layer;

forming a well region in the lower portion of the semiconductor fin by doping the semiconductor fin from the lower portion of the sidewall exposed by removing the portion of the first insulating layer, wherein the doping operation is performed prior to removing the mask layer from the upper portion of the sidewall of the semiconductor fin;

after doping the semiconductor fin, forming a second insulating layer on the exposed lower portion of the sidewall of the semiconductor fin and over the first insulating layer, while the upper portion of the sidewall of the semiconductor fin is covered by the mask layer; and exposing the upper portion of the sidewall of the semiconductor fin by removing the mask layer after forming the second insulating layer.

16. The method of claim 15, further comprising:

doping the semiconductor fin by an angle implantation operation.

17. The method of claim 16, wherein the doping the semiconductor fin by the angle implantation comprises performing a tilted angle implantation at energy below about 1KeV.

18. The method of claim 16, wherein a dopant concentration of the first insulating layer is greater than a dopant concentration of the second insulating layer, the first insulating layer being in direct contact with the substrate.

19. The method of claim 15, further comprising forming a high-k dielectric layer over the upper portion and the lower portion of the sidewall of the semiconductor fin and a top surface of the second insulating layer after removing the mask layer.

20. The method of claim 15, wherein a height of the first insulating layer is in a range from 60 nm to 100 nm.

* * * * *